(12) United States Patent
Arae et al.

(10) Patent No.: US 10,748,784 B2
(45) Date of Patent: Aug. 18, 2020

(54) FIELD EFFECT TRANSISTOR, METHOD FOR MANUFACTURING SAME, DISPLAY ELEMENT, DISPLAY DEVICE, AND SYSTEM

(71) Applicants: Sadanori Arae, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Minehide Kusayanagi, Kanagawa (JP)

(72) Inventors: Sadanori Arae, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Minehide Kusayanagi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/047,374

(22) Filed: Jul. 27, 2018

(65) Prior Publication Data

US 2018/0358236 A1 Dec. 13, 2018

Related U.S. Application Data

(63) Continuation of application No. PCT/JP2017/001458, filed on Jan. 18, 2017.

(30) Foreign Application Priority Data

Feb. 1, 2016 (JP) .................................. 2016-017556
Jun. 6, 2016 (JP) .................................. 2016-112375
Jun. 6, 2016 (JP) .................................. 2016-112946

(51) Int. Cl.
*H01L 29/786* (2006.01)
*H01L 29/66* (2006.01)
(Continued)

(52) U.S. Cl.
CPC .. *H01L 21/47635* (2013.01); *H01L 21/02192* (2013.01); *H01L 21/02194* (2013.01);
(Continued)

(58) Field of Classification Search
CPC ......... H01L 21/47635; H01L 21/02107; H01L 21/02109; H01L 21/02112;
(Continued)

(56) References Cited

U.S. PATENT DOCUMENTS 9,112,039 B2   8/2015 Ueda et al.
9,704,742 B2 * 7/2017 Fujiwara ............... H01L 29/458
(Continued)

FOREIGN PATENT DOCUMENTS

JP   H04-217370   8/1992
JP   4538636      9/2010
(Continued)

OTHER PUBLICATIONS

Extended European Search Report for 17747190.1 dated Feb. 18, 2019.
(Continued)

*Primary Examiner* — Natalia A Gondarenko
(74) *Attorney, Agent, or Firm* — IPUSA, PLLC

(57) ABSTRACT

A method is provided for manufacturing a field effect transistor that includes a gate insulating layer and an electrode including a first conductive film and a second conductive film successively laminated on a predetermined surface of the gate insulating layer. The method includes forming an oxide film including element A, which is an alkaline earth metal, and element B, which is at least one of Ga, Sc, Y and
(Continued)

a lanthanide, as the gate insulating layer; forming a first conductive film that dissolves in an organic alkaline solution on the oxide film; forming a second conductive film on the first conductive film; etching the second conductive film with an etching solution having a higher etch rate for the second conductive film as compared with that for the first conductive film; and etching the first conductive film with the organic alkaline solution using the second conductive film as a mask.

6 Claims, 19 Drawing Sheets

(51) Int. Cl.

| | |
|---|---|
| *H01L 29/51* | (2006.01) |
| *H01L 29/49* | (2006.01) |
| *H01L 27/12* | (2006.01) |
| *H01L 21/02* | (2006.01) |
| *H01L 21/441* | (2006.01) |
| *H01L 21/4763* | (2006.01) |
| *H01L 29/417* | (2006.01) |
| *H01L 21/3213* | (2006.01) |
| *H01L 29/45* | (2006.01) |
| *H01L 29/423* | (2006.01) |
| *G02F 1/1368* | (2006.01) |
| *H01L 27/32* | (2006.01) |

(52) U.S. Cl.
CPC ...... *H01L 21/32134* (2013.01); *H01L 21/441* (2013.01); *H01L 27/1225* (2013.01); *H01L 29/41733* (2013.01); *H01L 29/42384* (2013.01); *H01L 29/45* (2013.01); *H01L 29/4908* (2013.01); *H01L 29/4958* (2013.01); *H01L 29/517* (2013.01); *H01L 29/66742* (2013.01); *H01L 29/66969* (2013.01); *H01L 29/7869* (2013.01); *H01L 29/78609* (2013.01); *H01L 29/78693* (2013.01); *G02F 1/1368* (2013.01); *H01L 27/3262* (2013.01)

(58) Field of Classification Search
CPC ......... H01L 21/02225; H01L 21/02293; H01L 21/0228; H01L 21/02192; H01L 21/283; H01L 21/02194; H01L 21/441; H01L 21/32134; H01L 21/02403; H01L 21/02414; H01L 21/02472; H01L 21/02483; H01L 21/02554; H01L 21/02565; H01L 29/4908; H01L 29/4958; H01L 29/517; H01L 29/66969; H01L 29/78609; H01L 29/78693; H01L 29/78681–78696; H01L 27/1225; H01L 27/3262; H01L 29/78; H01L 29/786; H01L 29/41733; H01L 29/42384; H01L 29/45; H01L 29/66742; G02F 1/1368
USPC ........................ 257/43, 296; 438/199, 202, 3
See application file for complete search history.

(56) References Cited

U.S. PATENT DOCUMENTS

| | | | |
|---|---|---|---|
| 2006/0240674 A1* | 10/2006 | Monoe .............. | H01L 29/42384 438/717 |
| 2009/0183902 A1* | 7/2009 | Kubota ................. | C23C 14/185 174/257 |
| 2009/0246953 A1* | 10/2009 | Okamoto .................. | C23F 1/20 438/656 |
| 2010/0001324 A1* | 1/2010 | Furukawa ......... | H01L 21/31691 257/295 |
| 2011/0156027 A1 | 6/2011 | Yamazaki et al. | |
| 2012/0248451 A1 | 10/2012 | Sone et al. | |
| 2013/0002312 A1* | 1/2013 | Yamazaki ........... | H01L 27/0266 327/109 |
| 2013/0052814 A1 | 2/2013 | Clark | |
| 2013/0187236 A1* | 7/2013 | Xie ..................... | H01L 29/4966 257/369 |
| 2014/0151679 A1 | 6/2014 | Fleissner | |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2016/0190329 A1 | 6/2016 | Matsumoto et al. | |
| 2016/0267873 A1 | 9/2016 | Saotome et al. | |
| 2017/0207342 A1* | 7/2017 | Kao ........ | H01L 27/124 |

FOREIGN PATENT DOCUMENTS

| | | |
|---|---|---|
| JP | 2011-151370 | 8/2011 |
| JP | 2011-216845 | 10/2011 |
| JP | 2016-029716 | 3/2016 |
| TW | 201310548 | 3/2013 |
| TW | 201431066 | 8/2014 |
| WO | 2011/148728 | 12/2011 |

OTHER PUBLICATIONS

International Search Report dated Apr. 18, 2017 in PCT Application PCT/JP2017/001458 filed on Jan. 18, 2017.
Taiwanese Office Action dated Mar. 12, 2018 in TW Application No. 106102167 filed on Jan. 20, 2017.
Korean Office Action for 10-2018-7021852 dated Nov. 28, 2019.

* cited by examiner

LIGHT

FIELD EFFECT TRANSISTOR, METHOD FOR MANUFACTURING SAME, DISPLAY ELEMENT, DISPLAY DEVICE, AND SYSTEM

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2017/001458, filed on Jan. 18, 2017 and designating the U.S., which claims priority to Japanese Patent Application No. 2016-017556, filed on Feb. 1, 2016, Japanese Patent Application No. 2016-112375, filed on Jun. 6, 2016, and Japanese Patent Application No. 2016-112946, filed on Jun. 6, 2016. The entire contents of the foregoing applications are incorporated herein by reference.

BACKGROUND OF THE INVENTION

1. Field of the Invention

The present invention relates to a field effect transistor, a method for manufacturing a field effect transistor, a display element, a display device, and a system.

2. Description of the Related Art

Because field effect transistors (FETs) have low gate currents and flat structures, they are easier to manufacture and integrate as compared with bipolar transistors. As such, FETs are indispensable elements of integrated circuits used in current electronic devices.

Conventionally, a silicon-based insulating film has been widely used as a gate insulating layer of a field effect transistor. However, with growing demands for higher integration and lower power consumption in field effect transistors in recent years, techniques for forming a gate insulating layer using a so-called high-k insulating film that has a substantially higher dielectric constant as compared with a silicon-based insulating film are being contemplated. For example, a field effect transistor is known that includes a gate insulating layer using an oxide film containing a rare earth oxide, a rare earth silicate, a rare earth aluminate, or a rare earth element; aluminum; and silicon (e.g., see Japanese Patent No. 4538636).

On the other hand, issues relating to damage to the oxide film constituting the gate insulating layer during an etching process of etching an electrode that constitutes an upper layer of the gate insulating have not been addressed. That is, when damage such as film thinning of the gate insulating layer occurs during the etching process, for example, leakage current may be generated to thereby adversely affect the electric characteristics of the field effect transistor.

SUMMARY OF THE INVENTION

One aspect of the present invention is directed to providing a method for manufacturing a field effect transistor that includes a gate insulating layer made of an oxide film such that etching damage to the gate insulating layer can be prevented when patterning a conductive film on the gate insulating layer.

According to an embodiment of the present invention, a method is provided for manufacturing a field effect transistor that includes a gate insulating layer and an electrode including a first conductive film and a second conductive film sequentially laminated on a predetermined surface of the gate insulating layer. The method includes steps of forming an oxide film including element A, which is an alkaline earth metal, and element B, which is at least one element selected from a group consisting of Ga, Sc, Y, and a lanthanide; forming a first conductive film that dissolves in an organic alkaline solution on the oxide film; forming a second conductive film on the first conductive film; etching the second conductive film with an etching solution having a higher etch rate for the second conducive film as compared with an etch rate for the first conductive film; and etching the first conductive film with the organic alkaline solution using the second conductive film as a mask.

DESCRIPTION OF THE EMBODIMENTS

Figure 1:
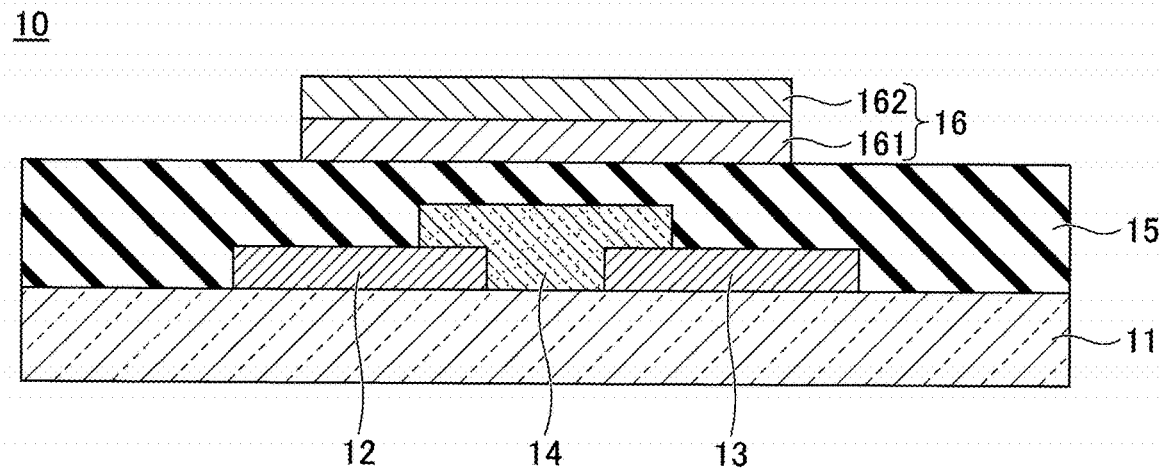
FIG. 1 is a cross-sectional view of a field effect transistor according to a first embodiment of the present invention.

In the following, embodiments of the present invention are described with reference to the accompanying drawings. Note that in the drawings, elements having substantially the same features and/or functions are given the same reference numerals and overlapping descriptions may be omitted.

First Embodiment

[Field Effect Transistor Configuration]

FIG. 1 is a cross-sectional view of a field effect transistor 10 according to a first embodiment of the present invention. The field effect transistor 10 illustrated in FIG. 1 is a top-gate/bottom-contact field effect transistor including a base material 11, a source electrode 12, a drain electrode 13, an active layer 14, a gate insulating layer 15, and a gate electrode 16. Note that the field effect transistor 10 is a representative example of a semiconductor device according to an embodiment of the present invention.

In the field effect transistor 10, the source electrode 12 and the drain electrode 13 are formed on the base material 11, which is an insulating material, and the active layer 14 is formed to partially cover the source electrode 12 and the drain electrode 13. Further, the gate insulating layer 15 is formed to cover the source electrode 12, the drain electrode 13, and the active layer 14. The gate electrode 16 is formed on the gate insulating layer 15. In the following, each of the above elements of the field effect transistor 10 will be described in detail.

Note that in the description of the present embodiment, for the sake of convenience, the side toward the gate electrode 16 is referred to as upper side or one side, and the side toward the base material 11 is referred to as lower side or other side. Also, a surface of each element toward the gate electrode 16 side is referred to as upper surface or one surface, and a surface of each element toward the base material 11 side is referred to as lower surface or other surface. Note, however, that the field effect transistor 10 can be turned upside down or oriented in any arbitrary angle upon being used. Further, a planar view refers to a view from the normal direction of the upper surface of the base material 11, and a planar shape refers to a shape as viewed from the normal direction of the upper surface of the base material 11.

The shape, structure, and size of the base material 11 are not particularly limited and may be suitably selected according to the purpose. The material of the base material 11 is not particularly limited and may be suitably selected according to the purpose, but for example, a glass base material, a ceramic base material, a plastic base material, a film base material, or the like may be used.

The glass base material is not particularly limited and may be suitably selected according to the purpose, but for example, alkali-free glass or silica glass may be used. The plastic base material and the film base material are not particularly limited and may be suitably selected according to the purpose, but for example, polycarbonate (PC), polyimide (PI), polyethylene terephthalate (PET), polyethylene naphthalate (PEN), or the like may be used.

The source electrode 12 and the drain electrode 13 are formed on the base material 11. The source electrode 12 and the drain electrode 13 are electrodes for extracting a current in response to the application of a gate voltage to the gate electrode 16. Note that wirings connected to the source electrode 12 and the drain electrode 13 may be formed in the same layer together with the source electrode 12 and the drain electrode 13.

The materials of the source electrode 12 and the drain electrode 13 are not particularly limited and may be suitably selected according to the purpose. For example, a metal, such as aluminum (Al), platinum (Pt), palladium (Pd), gold (Au), silver (Ag), copper (Cu), zinc (Zn), nickel (Ni), chromium (Cr), tantalum (Ta), molybdenum (Mo), titanium (Ti); an alloy thereof; or a mixture of one or more of the above metals may be used.

Also, a conductive oxide, such as indium oxide, zinc oxide, tin oxide, gallium oxide, or niobium oxide; a complex compound thereof; or a mixture of one or more of the above oxides may be used. The average film thickness of the source electrode 12 and the drain electrode 13 is not particularly limited and may be suitably selected according to the purpose, but for example, the average film thickness of the source electrode 12 and the drain electrode 13 is preferably from 10 nm to 1 μm, and more preferably from 50 nm to 300 nm.

The active layer 14 is formed on the base material 11 to partially cover the source electrode 12 and the drain electrode 13. Note that a portion of the active layer 14 located between the source electrode 12 and the drain electrode 13 forms a channel region. The average film thickness of the active layer 14 is not particularly limited and may be suitably selected according to the purpose, but for example, the average film thick of the active layer 14 is preferably from 5 nm to 1 μm, and more preferably from 10 nm to 0.5 μm.

The material of the active layer 14 is not particularly limited and may be suitably selected according to the purpose. For example, an organic semiconductor, such as polycrystalline silicon (p-Si), amorphous silicon (a-Si), an oxide semiconductor, or pentacene may be used. Among the above materials, an oxide semiconductor is preferably used from the viewpoint of securing stability of the interface with the gate insulating layer 15.

An oxide semiconductor that constitutes the active layer 14 may be an n-type oxide semiconductor, for example. The n-type oxide semiconductor is not particularly limited and may be suitably selected according to the purpose, but for example, the n-type oxide semiconductor preferably contains at least one element selected from a group consisting of indium (In), zinc (Zn), tin (Sn), and titanium (Ti); and an alkaline earth element or a rare earth element. More preferably the n-type oxide semiconductor contains In and an alkaline earth element or a rare earth element.

Examples of the alkaline earth element include beryllium (Be), magnesium (Mg), calcium (Ca), strontium (Sr), barium (Ba), and radium (Ra).

Examples of the rare earth element include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The electron carrier concentration of indium oxide varies within a range from about $10^{18}$ cm$^{-3}$ to $10^{20}$ cm$^{-3}$ depending on the amount of oxygen deficiency. Indium oxide is susceptible to oxygen deficiency such that unintended oxygen deficiency may occur in a subsequent process after forming the oxide semiconductor film. By forming an oxide primarily using two metals including indium and an alkaline earth element or a rare earth element which are more likely to bond with oxygen than indium, unintended oxygen deficiency may be prevented and composition control may be facilitated such that the electron carrier concentration may be suitably controlled.

Also, the n-type oxide semiconductor constituting the active layer 14 is preferably doped with at least one type of dopant selected from a group consisting of a divalent cation, a trivalent cation, a tetravalent cation, a pentavalent cation, a hexavalent cation, a heptavalent cation, and an octavalent cation through substitutional doping, and the valence number of the dopant is preferably greater than the valence number of the metal ion (excluding the dopant) constituting the n-type oxide semiconductor. Note that substitutional doping is also referred to as n-type doping.

The gate insulating layer 15 is interposed between the active layer 14 and the gate electrode 16 and is arranged to cover the source electrode 12 and the drain electrode 13. The gate insulating layer 15 is a layer for insulating the source electrode 12 and the drain electrode 13 from the gate electrode 16. The average film thickness of the gate insulating layer 15 is not particularly limited and may be suitably selected according to the purpose, but for example, the average thickness of the gate insulating layer 15 is preferably from 50 nm to 1000 nm, and more preferably from 100 nm to 500 nm.

The gate insulating layer 15 is an oxide film. The oxide film constituting the gate insulating layer 15 contains at least element A, which is an alkaline earth metal, and element B, which is at least one element selected from a group consisting of gallium (Ga), scandium (Sc), yttrium (Y), and a lanthanide. Preferably, the oxide film also contains element C, which is at least one element selected from a group consisting of Zr (zirconium) and Hf (hafnium). Further, the oxide film may contain other components as necessary. The alkaline earth metal contained in the oxide film may be one type of alkaline earth metal or two or more types of alkaline earth metals.

Examples of the lanthanide that may be contained in the oxide film include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Preferably, the oxide film contains a paraelectric amorphous oxide or consists of the paraelectric amorphous oxide. The paraelectric amorphous oxide is stable in the atmosphere and can stably form an amorphous structure in a wide composition range. Note, however, that crystals may be contained in a part of the oxide film.

Alkaline earth oxides easily react with moisture and carbon dioxide in the atmosphere and can easily change into hydroxides or carbonates. As such, alkaline earth oxides are not suitably used alone for application in electronic devices. Also, simple oxides of Ga, Sc, Y, and a lanthanide other than Ce easily crystallize such that leakage currents may become a problem. However, a composite oxide of an alkaline earth metal and at least one of Ga, Sc, Y, and a lanthanide other than Ce may be stable in the atmosphere and may form an amorphous film in a wide composition range. Note that because Ce is an exception to lanthanides in that it is tetravalent and forms a crystal with a perovskite structure when combined with an alkaline earth metal, the composite oxide preferably contains a lanthanide other than Ce in order to obtain an amorphous phase.

Although a crystal phase such as a spinel structure exists between an alkaline earth metal and a Ga oxide, these crystals, unlike perovskite structure crystals, do not easily precipitate unless the temperature is very high (generally at least 1000° C.). Also, a stable crystal phase between an alkaline earth metal oxide and an oxide of Sc, Y, and a lanthanide other than Ce has not been reported, and crystal precipitation of the composite oxide from the amorphous phase would be rare even if it is subjected to a high-temperature post-process. Also, the amorphous phase may be further stabilized when the composite oxide of an alkaline earth metal and at least one of Ga, Sc, Y, and a lanthanide other than Ce constitutes at least three types of metal elements.

Although the content of each element contained in the oxide film is not particularly limited, the content of each metal element selected from each element group is preferably adjusted to achieve a composition for obtaining a stable amorphous state.

Note that from the viewpoint of manufacturing a high dielectric constant film, the composition ratio of elements such as Ba, Sr, Lu, La and the like are preferably increased.

Because the oxide film according to the present embodiment can form an amorphous film in a wide composition range, physical properties can also be controlled over a wide range. For example, by selectively adjusting the composition of the oxide film according to the purpose, the relative permittivity of the oxide film may be controlled to a suitable value within a range from about 6 to 20, which is sufficiently higher than the relative permittivity of $SiO_2$.

Further, the thermal expansion coefficient of the oxide film may be within a range from $10^{-6}$ to $10^{-5}$, which is a typical range for general wiring materials and semiconductor materials. In this way, as compared with $SiO_2$, which has a coefficient of thermal expansion coefficient in the order of $10^{-7}$, the oxide film may be less susceptible to peeling and the like even when it is repeatedly subjected to a heating process, for example. In particular, an oxide semiconductor such as a-IGZO forms a good interface.

Thus, by using the oxide film according to the present embodiment as the gate insulating layer 15, a high performance semiconductor device can be obtained.

The gate electrode 16 is formed over a predetermined region on the gate insulating layer 15. The gate electrode 16 is an electrode to which a gate voltage is applied. The gate electrode 16 may be a laminated film having a metal film 162 laminated on a metal film 161.

The material of the metal film 161 is not particularly limited and may be suitably selected according to the purpose as long as it is made of a metal, an alloy, or a mixture of a plurality of metals that can be etched with an etching solution made of an organic alkaline solution. For example, the metal film 161 may be made aluminum (Al) or an Al alloy (an alloy mainly composed of Al). Note, however, that the metal film 161 may also be replaced by a conductive film other than a metal film (e.g., a conductive oxide film) as long as the conductive film can be etched with an etching solution made of an organic alkaline solution.

Examples of the organic alkaline solution that may be used as the etching solution include strong alkaline solutions such as tetramethylammonium hydroxide (TMAH), 2-hydroxyethyl(trimethyl)ammonium hydroxide (CHOLINE), and monoethanolamine (MEA).

The material of the metal film 162 is not particularly limited and may be suitably selected according to the purpose as long as it is a metal, an alloy, or a mixture of a plurality of metals that has etching resistance to an organic alkaline solution and can be etched by a predetermined etching solution at a higher etch rate as compared with the etch rate for the metal film 161. For example, the material of the metal film 162 may be a metal, such as molybdenum (Mo), tungsten (W), titanium (Ti), tantalum (Ta), chromium (Cr), copper (Cu), or Nickel (Ni), an alloy thereof, or a mixture of one or more of these metals. Note, however, that the metal film 162 may be replaced by a conductive film other than a metal film (e.g., conductive oxide film) as long as the conductive film has etching resistance to an organic alkaline solution and can be etched by a predetermined etching solution at a higher etch rate as compared with the etch rate for the metal film 161 (or alternatively a conductive film used in place of the metal film 161).

The average film thickness of the metal film 161 is not particularly limited and may be suitably selected according to the purpose, but for example, the average film thickness of the metal film 161 is preferably from 10 nm to 200 nm, and more preferably from 50 nm to 100 nm. The average film thickness of the metal film 162 is not particularly limited and may be suitably selected according to the purpose, but for example, the average film thickness of the metal film 162 is preferably from 10 nm to 200 nm, and more preferably from 50 nm to 100 nm.

[Method for Manufacturing Field Effect Transistor]

In the following, a method for manufacturing the field effect transistor 10 of FIG. 1 will be described. FIGS. 2-8 are diagrams illustrating process steps of manufacturing the field effect transistor according to the first embodiment.

Figure 2:
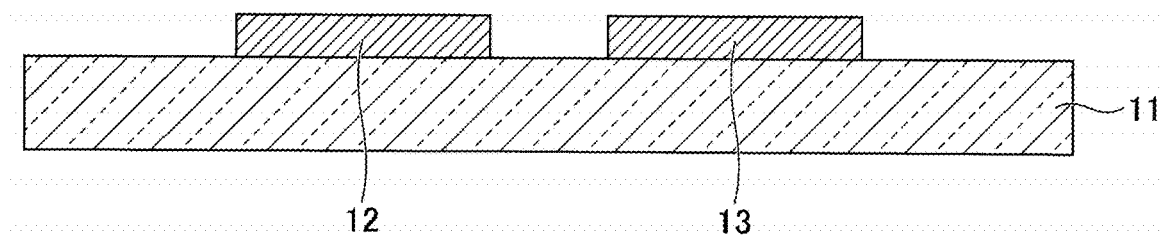
FIG. 2 is a first diagram illustrating a process step of manufacturing the field effect transistor according to the first embodiment.

First, in the process step illustrated in FIG. 2, the base material 11 made of a glass base material or the like is prepared, and the source electrode 12 and the drain electrode 13 are formed on the base material 11. The material and the thickness of the base material 11 can be suitably selected as described above. Also, the base material 11 is preferably subjected to a pretreatment process such as oxygen plasma, UV ozone, or UV irradiation cleaning, in order to clean the surface of the base material 11 and improve adhesion.

The method for forming the source electrode 12 and the drain electrode 13 is not particularly limited and may be suitably selected according to the purpose. For example, the source electrode 12 and the drain electrode 13 may be patterned through photolithography after forming a film on the base material 11 through a sputtering method, a vacuum evaporation method, a dip coating method, a spin coating method, a die coating method, or the like. As another example, the source electrode 12 and the drain electrode 13 may be directly formed into desired shapes by a printing process such as inkjet printing, nanoimprint, gravure, or the like.

Figure 3:
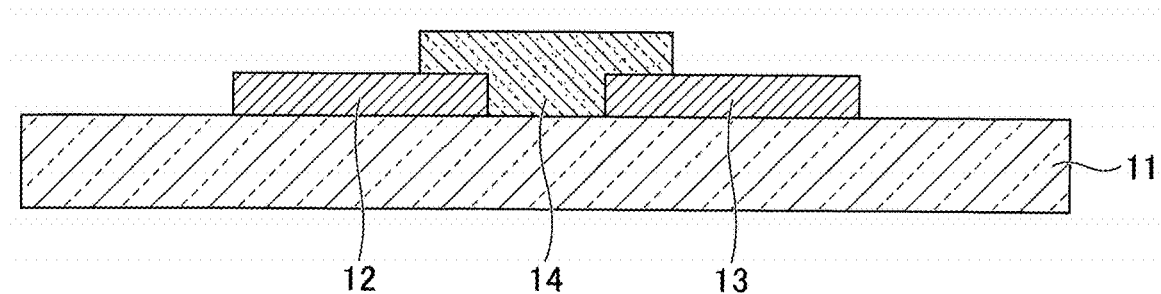
FIG. 3 is a second diagram illustrating a process step of manufacturing the field effect transistor according to the first embodiment.

Next, in the process step illustrated in FIG. 3, the active layer 14 is formed on the source electrode 12 and the drain electrode 13. The method of forming the active layer 14 is not particularly limited and may be suitably selected according to the purpose. For example, the active layer 14 may be patterned through photolithography after forming a film on the source electrode 12 and the drain electrode 13 through a vacuum process, such as a sputtering method, a pulsed laser deposition (PLD) method, a chemical vapor deposition (CVD) method, or an atomic layer deposition (ALD); or a solution process, such as a dip coating method, a spin coating method, a die coating method, or the like. As another example, the active layer 14 may be directly formed into a desired shape by a printing process such as inkjet printing, nanoimprint, gravure, or the like.

Figure 4:
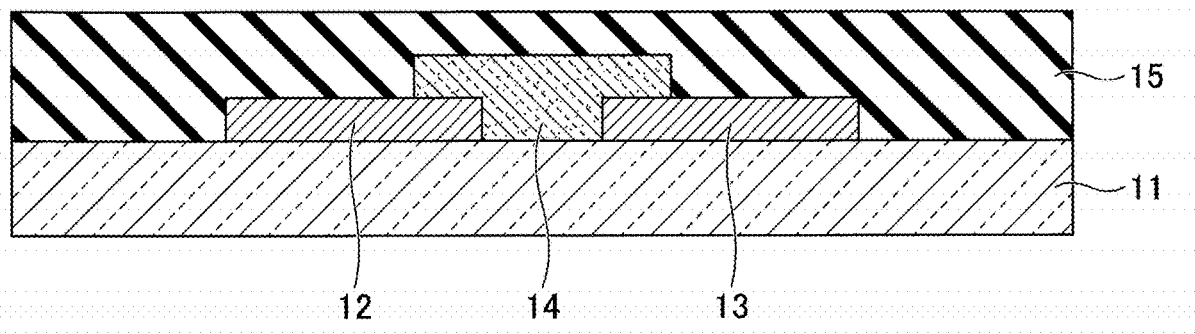
FIG. 4 is a third diagram illustrating a process step of manufacturing the field effect transistor according to the first embodiment.

Next, in the process step illustrated in FIG. 4, the gate insulating layer 15 covering the source electrode 12, the drain electrode 13, and the active layer 14 is formed on the base material 11. The method for forming the gate insulating layer 15 is not particularly limited and may be suitably selected according to the purpose. For example, the gate insulating layer 15 may be formed by a vacuum process, such as a sputtering method, a pulsed laser deposition (PLD) method, a chemical vapor deposition (CVD) method, or an atomic layer deposition (ALD) method; or a solution process, such as a dip coating method, a spin coating method, a die coating method, or the like. As another example, the gate insulating layer 15 may be directly formed into a desired shape by a printing process such as inkjet printing, nanoimprint, gravure or the like. The material and the thickness of the gate insulating layer 15 may be suitably selected as described above.

Figure 5:
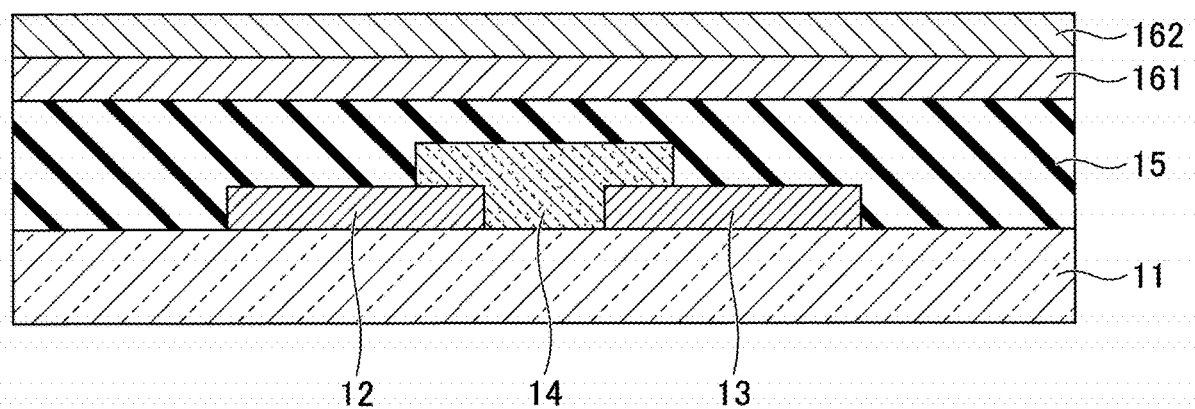
FIG. 5 is a fourth diagram illustrating a process step of manufacturing the field effect transistor according to the first embodiment.

Next, in the process step illustrated in FIG. 5, the metal films 161 and 162 are sequentially laminated on the gate insulating layer 15. The method for forming the metal films 161 and 162 is not particularly limited and may be suitably selected according to the purpose. For example, the metal films 161 and 162 may be formed by a vacuum process, such as a sputtering method, a pulsed laser deposition (PLD) method, a chemical vapor deposition (CVD) method, or an atomic layer deposition (ALD) method; or a solution process, such as a dip coating method, a spin coating method, a die coating method, or the like. As another example, the metal films 161 and 162 may be formed by a printing process such as inkjet printing, nanoimprint, gravure, or the like. The materials and thicknesses of the metal films 161 and 162 may be suitably selected as described above.

Figure 6:
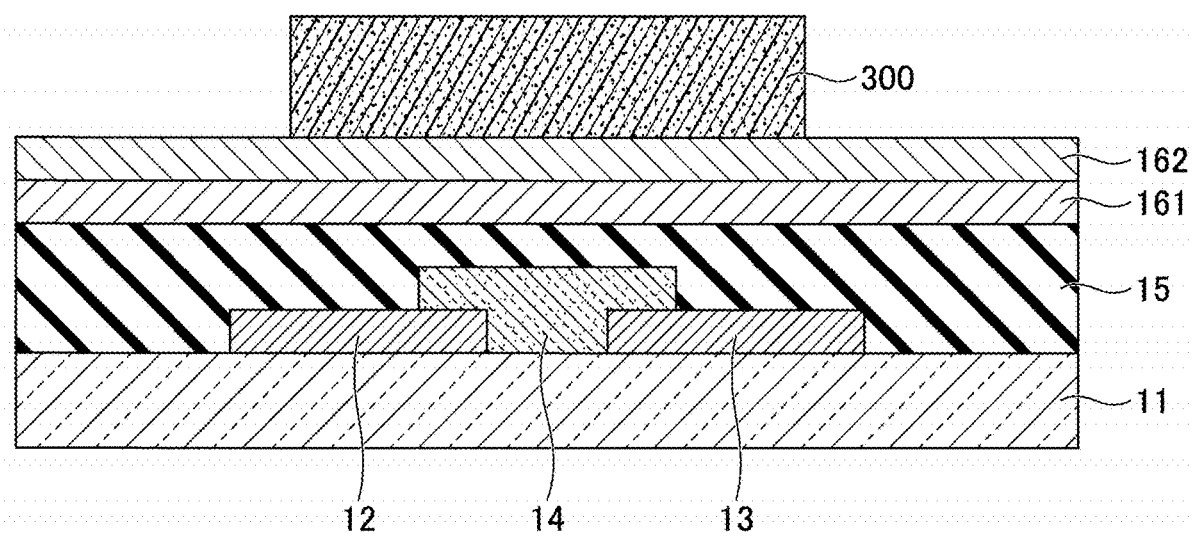
FIG. 6 is a fifth diagram illustrating a process step of manufacturing the field effect transistor according to the first embodiment.

Next, in the process step illustrated in FIG. 6, a resist made of a photosensitive resin is formed on the metal film 162, and exposure and development (photolithography) are performed to form a resist layer 300 covering a region on the metal film 162 where the gate electrode 16 is to be formed.

Figure 7:
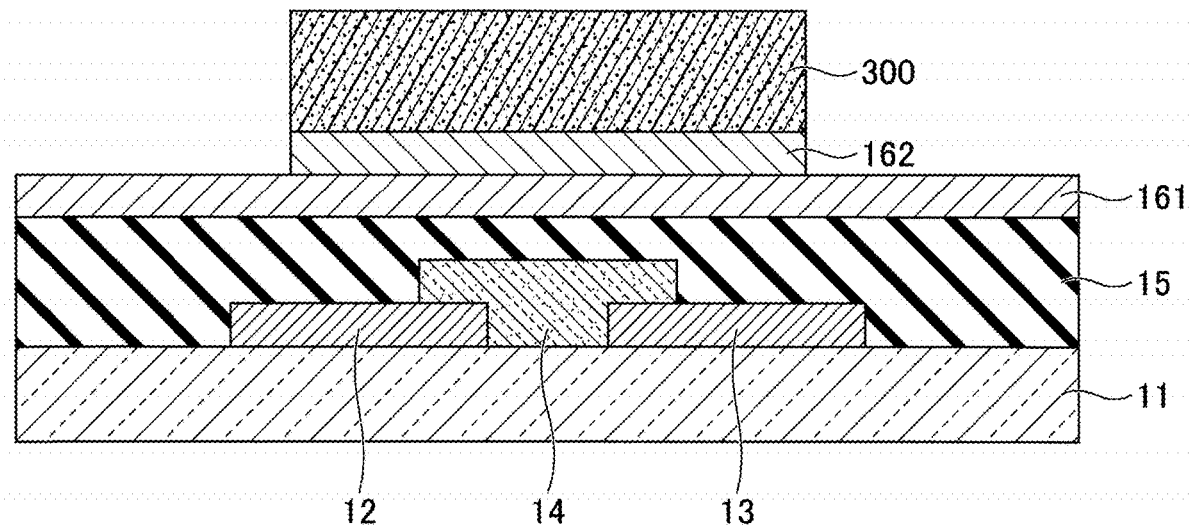
FIG. 7 is a sixth diagram illustrating a process step of manufacturing the field effect transistor according to the first embodiment.

Next, in the process step illustrated in FIG. 7, the resist layer 300 is used as an etching mask to etch and remove the metal film 162 that is arranged on a region not covered by the resist layer 300. By etching the metal film 162 with an etching solution that can etch the metal film 162 at a higher etch rate as compared with the etch rate for the metal film 161, the metal film 162 may be etched from the region not covered by the resist layer 300 while the metal film 161 may hardly be etched. The ratio of the etch rate for the metal film 161 to the etch rate for the metal film 162 is preferably arranged to be greater than or equal to 1:10. Note that the resist layer 300 has etching resistance to the etching solution used in this process step.

Figure 8:
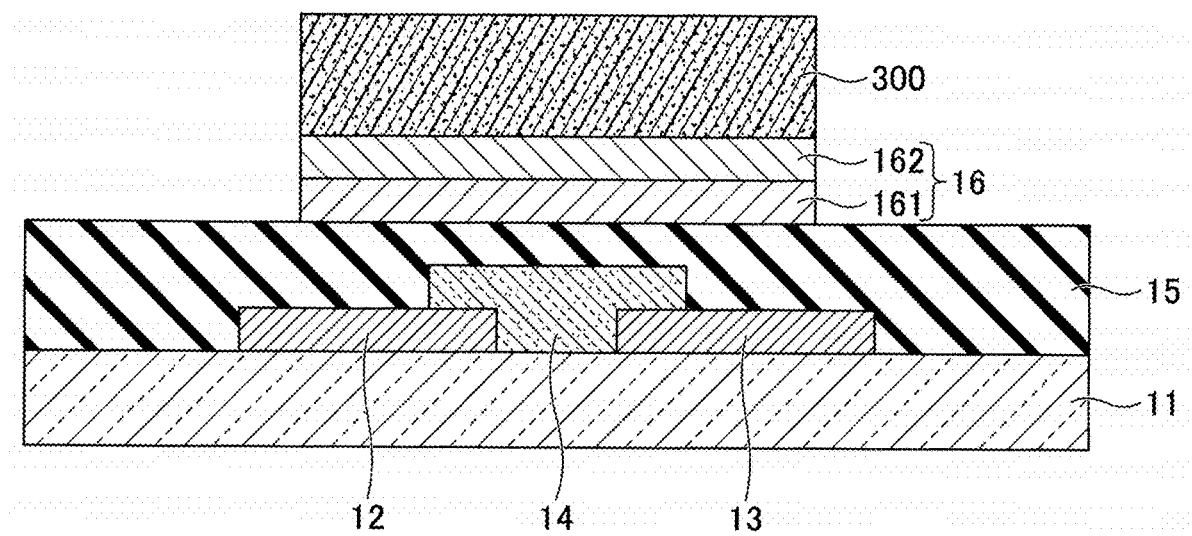
FIG. 8 is a seventh diagram illustrating a process step of manufacturing the field effect transistor according to the first embodiment.

Next, in the process step illustrated in FIG. 8, the metal film 161 arranged on a region not covered by the metal film 162 is removed by etching. In this step, an organic alkaline solution is used as an etching solution. The resist layer 300 is soluble in the organic alkaline solution. On the other hand, the metal film 162 has etching resistance to the organic alkaline solution. Thus, even if the resist layer 300 is dissolved, the metal film 161 can be etched into a desired shape using the metal film 162 as a mask.

Through the above process step, the gate electrode 16 made of a laminated film having the metal film 162 laminated on the metal film 161 may be formed, and the process of manufacturing the top-gate/bottom-contact field effect transistor 10 (see FIG. 1) may be completed.

As described above, according to the first embodiment, a laminated film having the metal film 162 laminated on the metal film 161 is provided as an electrode formed on a predetermined surface of the gate insulating layer 15 that is made of an oxide film. The metal film 161 is made of a metal, an alloy, or a mixture of a plurality of metals that can be etched with an etching solution made of an organic alkaline solution. Further, the metal film 162 is made of a metal, an alloy, or a mixture of a plurality of metals that has etching resistance to an organic alkaline solution and can be etched by a predetermined etching solution at a higher etch rate as compared with the etch rate for the metal film 161.

In this way, the metal film 162 may function as a mask when the metal film 161 is etched with an organic alkaline solution so that the metal film 161 may be etched into a desired shape.

Also, the organic alkaline solution can selectively etch the metal film 161 with respect to the gate insulating layer 15 that is made of an oxide film containing element A, which is an alkaline earth metal, and element B, which is at least one element selected from a group consisting of Ga, Sc, Y, and a lanthanide. In this way, etching damage to the gate insulating layer 15 may be prevented such that the gate insulating layer 15 may be protected from film thinning and good insulating properties may be maintained. As a result, a field effect transistor having good electric characteristics may be obtained.

Modification of First Embodiment

As example modifications of the first embodiment, field effect transistors having configurations other than the top-gate/bottom-contact configuration will be described. In the following descriptions of the example modifications of the first embodiment, descriptions of elements and features that are substantially identical to those of the previously described embodiment may be omitted.

Figure 9:
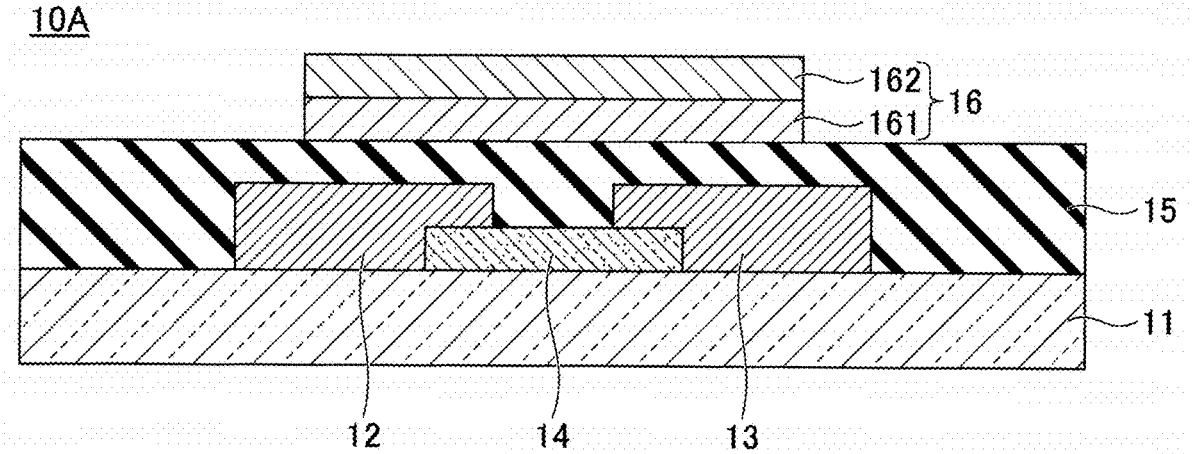
FIG. 9 is a cross-sectional view a field effect transistor according to a first example modification of the first embodiment.
Figure 10:
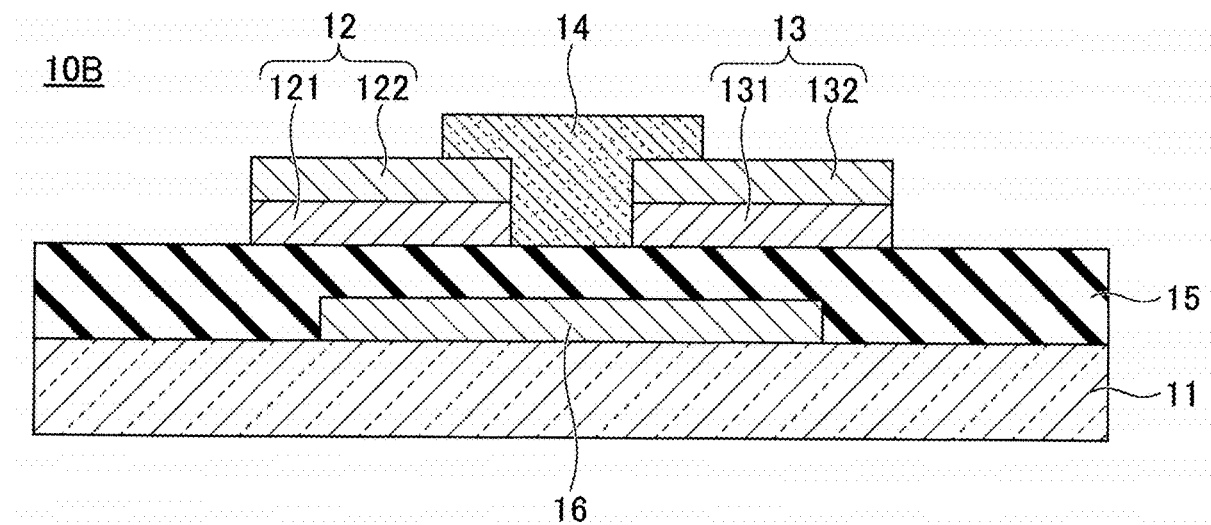
FIG. 10 is a cross-sectional view of a field effect transistor according to a second example modification of the first embodiment.
Figure 11:
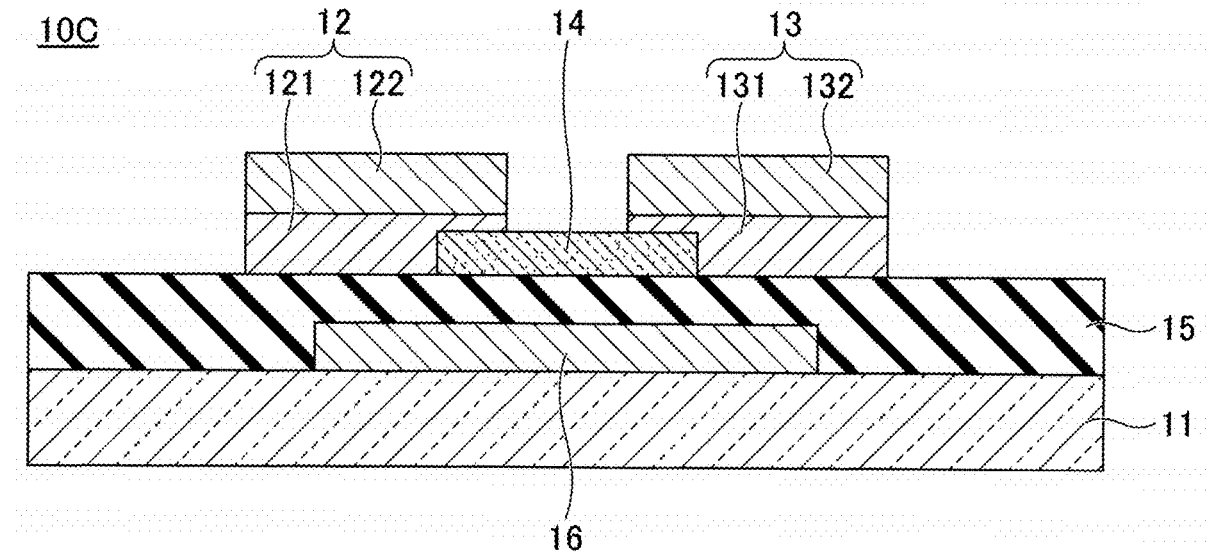
FIG. 11 is a cross-sectional view of a field effect transistor according to a third example modification of the first embodiment.

FIGS. 9-11 are cross-sectional views of field effect transistors according to example modifications of the first embodiment. Each of the field effect transistors illustrated in FIGS. 9-11 is a representative example of a semiconductor device according to an embodiment of the present invention.

The field effect transistor 10A illustrated in FIG. 9 is a top-gate/top-contact field effect transistor. In the field effect transistor 10A, the active layer 14 is formed on the insulating base material 11, and the source electrode 12 and the drain electrode 13 are formed on the active layer 14. The source electrode 12 and the drain electrode 13 are spaced apart by a predetermined distance to form a channel region of the active layer 14. Further, the gate insulating layer 15 is formed to cover the source electrode 12, the drain electrode 13, and the active layer 14, and the gate electrode 16 is formed on the gate insulating layer 15. As with the field effect transistor 10 (see FIG. 1), the gate electrode 16 of the field effect transistor 10A is made of a laminated film having the metal film 162 laminated on the metal film 161.

The field effect transistor 10A may be manufactured by altering the execution order of the process step illustrated in FIG. 2 and the process step illustrated in FIG. 3.

The field effect transistor 10B illustrated in FIG. 10 is a bottom-gate/bottom-contact field effect transistor. In the field effect transistor 10B, the gate electrode 16 is formed on the insulating base material 11, and the gate insulating layer 15 is formed to cover the gate electrode 16. Further, the source electrode 12 and the drain electrode 13 are formed on the gate insulating layer 15, and the active layer 14 is formed to partially cover the source electrode 12 and the drain electrode 13. The source electrode 12 and the drain electrode 13 are spaced apart by a predetermined distance to form a channel region of the active layer 14.

In the field effect transistor 10B, the source electrode 12 may be a laminated film having a metal film 122 laminated on a metal film 121. Further, the drain electrode 13 may be a laminated film having a metal film 132 laminated on a metal film 131. Note that the materials and film forming methods used for the metal films 121 and 131 may be the same as the material and film forming method used for the metal film 161, for example. The materials and film forming methods used for the metal films 122 and 132 may be the same as the material and film forming method used for the metal film 162, for example.

The field effect transistor 100 illustrated in FIG. 11 is a bottom-gate/top-contact field effect transistor. In the field effect transistor 100, the gate electrode 16 is formed on the insulating base material 11, and the gate insulating layer 15 is formed to cover the gate electrode 16. Further, the active layer 14 is formed on the gate insulating layer 15, and the source electrode 12 and the drain electrode 13 are formed on the active layer 14. The source electrode 12 and the drain electrode 13 are spaced apart by a predetermined distance to form a channel region of the active layer 14.

In the field effect transistor 100, the source electrode 12 may be a laminated film having the metal film 122 laminated on the metal film 121. Further, the drain electrode 13 may be a laminated film having the metal film 132 laminated on the metal film 131. Note that the materials and film forming methods used for the metal films 121 and 131 may be the same as the material and film forming method used for the metal film 161, for example. The materials and film forming methods used for the metal films 122 and 132 may be the same as the material and film forming method used for the metal film 162, for example.

As described above, the layer configuration of the field effect transistor according to the present invention is not particularly limited, and a suitable configuration may be selected from the configurations illustrated in FIG. 1 and FIGS. 9-11 according to the purpose, for example. Note that the field effect transistors 10A, 10B, and 100 illustrated in FIGS. 9-11 may achieve effects similar to those of the field effect transistor 10.

Second Embodiment

As a second embodiment of the present invention, an example configuration in which the gate electrode is a laminated film having three laminated layers of metal films will be described. Note that in the following description of the second embodiment, descriptions of features and elements that are substantially the same as those of the previously described embodiments may be omitted.

[Field Effect Transistor Configuration]

Figure 12:
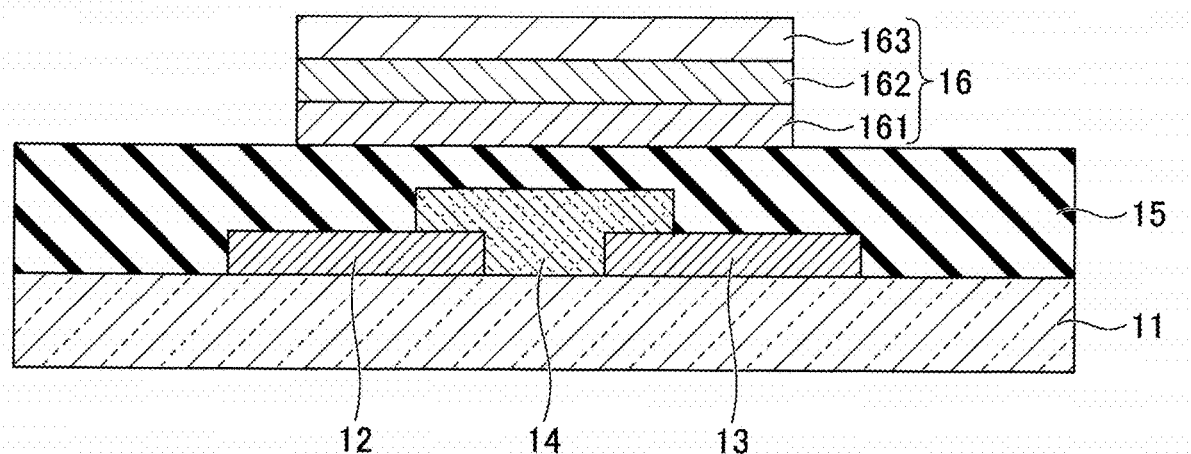
FIG. 12 is a cross-sectional view of a field effect transistor according to a second embodiment of the present invention.
Figure 13:
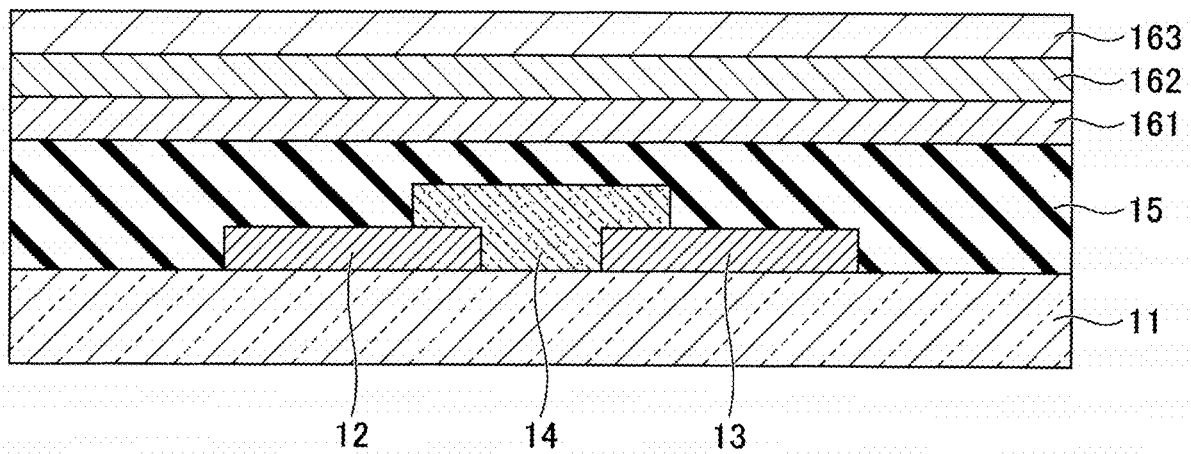
FIG. 13 is a first diagram illustrating a process step of manufacturing the field effect transistor according to the second embodiment.

FIG. 12 is a cross-sectional view of a field effect transistor 10D according to the second embodiment. As can be appreciated from FIG. 12, the field effect transistor 10D differs from the field effect transistor 10 (see FIG. 1) in that the gate electrode 16 is a laminated film having a metal film 162 and a metal film 163 sequentially laminated on a metal film 161.

The material of the metal film 161 is not particularly limited and may be suitably selected from the example materials of the metal film 161 described above in connection with the first embodiment.

The material of the metal film 162 is not particularly limited and may be selected according to the purpose as long as it is a metal, an alloy or a mixture of a plurality of metals that has etching resistance to an organic alkaline solution and can be etched by a predetermined etching solution at a higher etch rate as compared with the etch rate for the metal film 161. For example, the material of the metal film 162 may be a metal, such as molybdenum (Mo), tungsten (W), tantalum (Ta), chromium (Cr), gold (Au), copper (Cu), or Nickel (Ni), an alloy thereof, or a mixture of one or more of these metals.

Note, however, that the metal film 162 may be replaced by a conductive film other than a metal film (e.g., conductive oxide film) as long as the conductive film has etching resistance to an organic alkaline solution and can be etched by a predetermined etching solution at a higher etch rate as compared with the etch rate for the metal film 161 (or a conductive film used in place of the metal film 161).

The material of the metal film 163 is not particularly limited and may be suitably selected according to the purpose as long as it is a metal, an alloy, or a mixture of a plurality of metals that has etching resistance to an organic alkaline solution and can be etched by a predetermined etching solution at a higher etch rate as compared with the etch rate for the metal film 162. For example, the material of the metal film 163 may be a metal such as titanium (Ti), an alloy thereof, or a mixture including such metal.

Note, however, that the metal film 163 may be replaced by a conductive film other than a metal film (e.g., conductive oxide film) as long as the conductive film has etching resistance to an organic alkaline solution and can be etched by a predetermined etching solution at a higher etch rate as compared with the etch rate for the metal film 162 (or a conductive film used in place of the metal film 162).

Also, the metal film 163 is preferably made of a metal having higher heat resistance than the metal film 162.

The average film thickness of the metal film 161 is not particularly limited and may be suitably selected according to the purpose, but for example, the average film thickness of the metal film 161 is preferably from 10 nm to 200 nm, and more preferably from 50 nm to 100 nm. The average film thickness of the metal film 162 is not particularly limited and may be suitably selected according to the purpose, but for example, the average film thickness of the metal film 162 is preferably from 10 nm to 200 nm, and more preferably from 50 nm to 100 nm. The average film thickness of the metal film 163 is not particularly limited and may be suitably selected according to the purpose, but for example, the average film thickness of the metal film 163 is preferably from 10 nm to 200 nm, and more preferably from 50 nm to 100 nm.

[Method for Manufacturing Field Effect Transistor]

In the following, a method for manufacturing the field effect transistor 10D of FIG. 12 will be described. FIGS. 13-16 are diagrams illustrating process steps of manufacturing the field effect transistor according to the second embodiment.

First, process steps substantially identical to those of the first embodiment as illustrated in FIGS. 2-4 are executed. Next, in the process step illustrated in FIG. 13, the metal films 161, 162, and 163 are sequentially laminated on the gate insulating layer 15. The method for forming the metal films 161, 162, and 163 is not particularly limited and may be suitably selected according to the purpose. Examples of the method include vacuum processes, such as a sputtering method, a pulsed laser deposition (PLD) method, a chemical vapor deposition (CVD) method, and an atomic layer deposition (ALD) method, and solution processes, such as a dip coating process, a spin coating process, a die coating process, and the like. Other examples include printing processes such as inkjet printing, nanoimprint, gravure, and the like. The materials and the thicknesses of the metal films 161, 162, and 163 may be suitably selected as described above.

Figure 14:
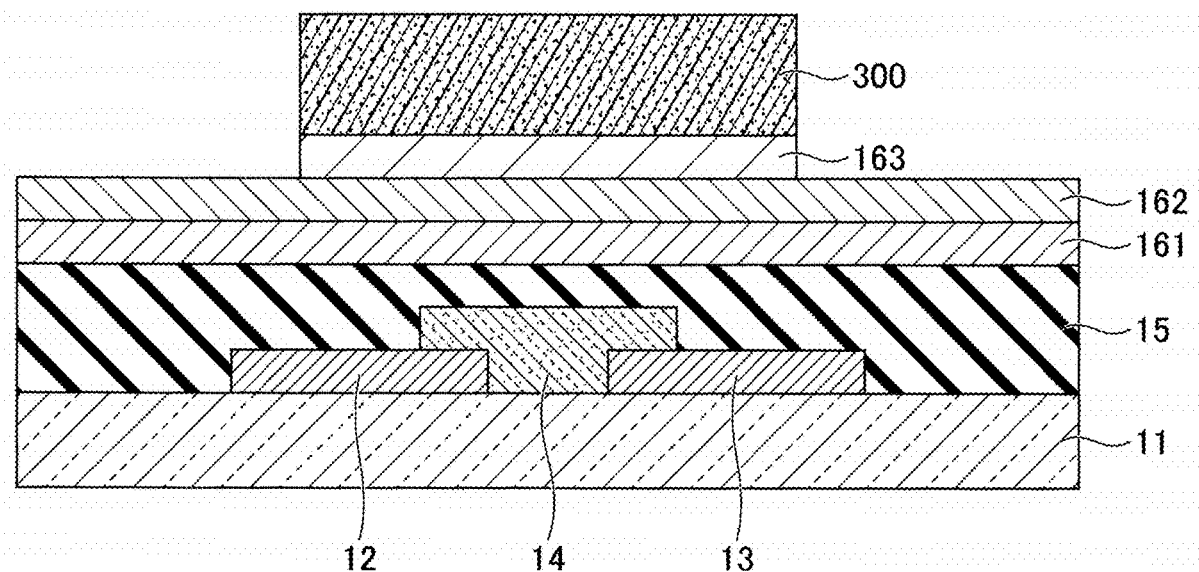
FIG. 14 is a second diagram illustrating a process step of manufacturing the field effect transistor according to the second embodiment.

In the process step illustrated in FIG. 14, a resist made of a photosensitive resin is formed on the metal film 163, and exposure and development (photolithography) are performed to form a resist layer 300 covering a region on the metal film 163 where the gate electrode 16 is to be formed.

The resist layer 300 is used as an etching mask to etch and remove the metal film 163 from a region not covered by the resist layer 300. By etching the metal film 163 with an etching solution having a higher etch rate for the metal film 163 as compared with that for the metal film 162, only the metal film 162 may be etched and removed from the region not covered by the resist layer 300 while the metal film 162 may hardly be etched. The ratio of the etch rate for the metal film 162 to the etch rate for the metal film 163 is preferably greater than or equal to 1:10. Note that the resist layer 300 has etching resistance to the etching solution used in this step.

Figure 15:
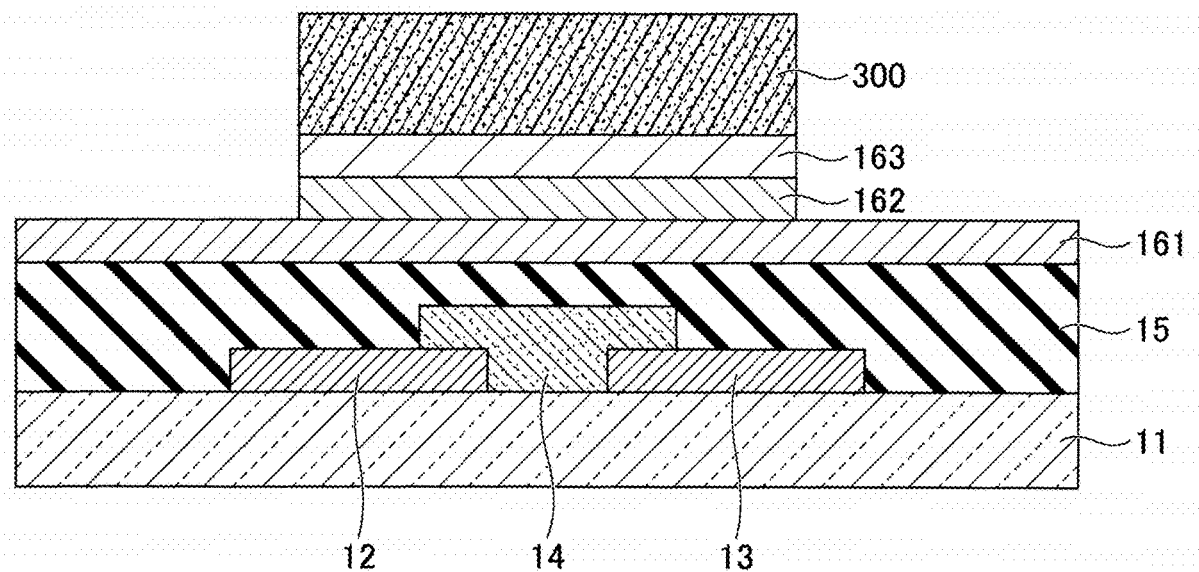
FIG. 15 is a third diagram illustrating a process step of manufacturing the field effect transistor according to the second embodiment.

Next, in the process step illustrated in FIG. 15, the metal film 162 is etched and removed from a region not covered by the resist layer 300 using the resist layer 300 as an etching mask. By etching the metal film 162 with an etching solution having a higher etch rate for the metal film 162 as compared with that for the metal film 161, only the metal film 162 may be etched and removed from the region not covered by the resist layer 300 while the metal film 161 may hardly be etched. The ratio of the etch rate for the metal film 161 to the etch rate for the metal film 162 is preferably greater than or equal to 1:10. Note that the resist layer 300 has etching resistance to the etching solution used in this step.

Figure 16:
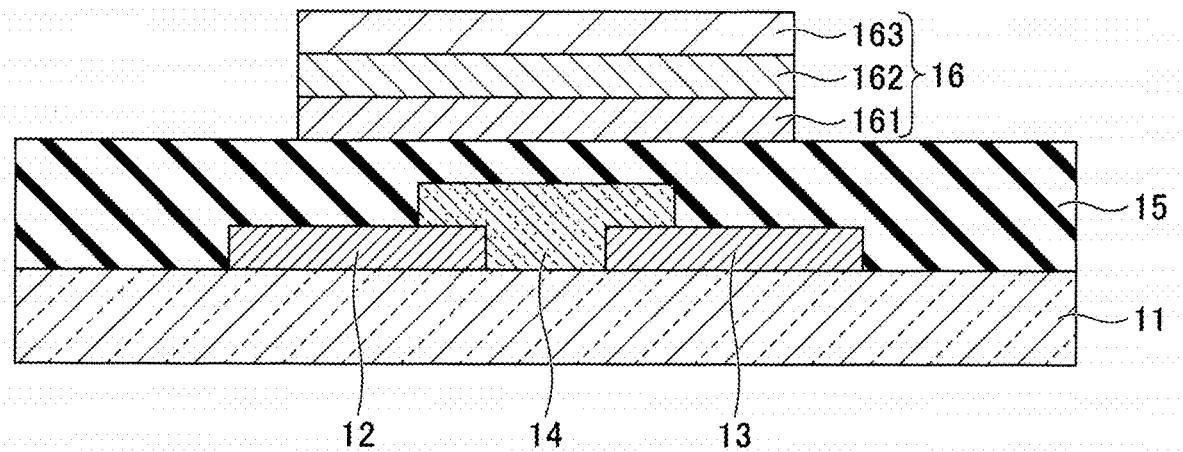
FIG. 16 is a fourth diagram illustrating a process step of manufacturing the field effect transistor according to the second embodiment.

Next, in the process step illustrated in FIG. 16, the metal film 161 is etched and removed from a region not covered by the metal films 162 and 163. In this step, an organic alkaline solution is used as an etching solution. The resist layer 300 is soluble in the organic alkaline solution. On the other hand, the metal films 162 and 163 have etching resistance to the organic alkaline solution. Thus, even if the resist layer 300 is dissolved, the metal film 161 can be etched into a desired shape using the metal films 162 and 163 as masks. Note that although the resist layer 300 dissolves gradually, FIG. 16 illustrates a state in which the resist layer 300 has completely dissolved.

In the above-described process steps for manufacturing the field effect transistor 10D according to the second embodiment, the resist layer 300 may be completely dissolved in the process step illustrated in FIG. 16 such that a separate process step for removing the resist layer 300 does not have to be implemented. In this way, the process of manufacturing the field effect transistor 10D may be simplified, and manufacturing costs of the field effect transistor 10D may be reduced.

Note, however, that because the metal films 162 and 163 function as etching masks in the process step illustrated in FIG. 16, for example, after executing the process step illustrated in FIG. 15, the resist layer 300 may be removed beforehand, and the metal film 161 may be etched using the metal films 162 and 163 as etching masks thereafter.

Through the above-described process steps, the gate electrode 16 that is made of a laminated film having the metal films 162 and 163 sequentially laminated on the metal film 161 may be formed, and the process of manufacturing the top-gate/bottom-contact field effect transistor 10D (see FIG. 16) may be completed.

Note that in some cases, after the process step of FIG. 16 (sometimes not immediately after the process step of FIG. 16), an annealing process (e.g., at about 300° C. to 400° C.) may be performed on the field effect transistor 10D in order to improve the reliability of the active layer 14 that is made of an oxide semiconductor. In this case, the surface of the gate electrode 16 may be roughened by the annealing process, and the gate electrode 16 may not adequately function as an electrode. However, according to the second embodiment, the metal film 163 corresponding to the uppermost layer of the gate electrode 16 is made of a metal (e.g., Ti) having higher heat resistance than the metal film 162 (e.g., Mo), and in this way, the surface of the electrode 16 can be prevented from roughening.

As described above, in the second embodiment, a laminated film having the metal films 162 and 163 sequentially laminated on the metal film 161 is provided as an electrode formed on a predetermined surface of the gate insulating layer 15 made of an oxide film. Further, the metal film 161 is made of a metal, an alloy, or a mixture of a plurality of metals that can be etched with an etching solution made of an organic alkaline solution.

Also, the metal film 162 is made of a metal, an alloy, or a mixture of a plurality of metals that has etching resistance to an organic alkaline solution and can be etched by a predetermined etching solution at a higher etch rate as compared with the etch rate for the metal film 161. The metal film 163 is made of a metal, an alloy, or a mixture of a plurality of metals that has etching resistance to an organic alkaline solution and can be etched by a predetermined etching solution at a higher etch rate as compared with the etch rate for the metal film 162.

In this way, when the metal film 161 is etched with an organic alkaline solution, the metal films 162 and 163 function as masks so that the metal film 161 may be etched into a desired shape.

Also, the organic alkaline solution can selectively etch the metal film 161 with respect to the gate insulating layer 15 that is made of an oxide film containing element A, which is an alkaline earth metal, and element B, which is at least one element selected from a group consisting of Ga, Sc, Y, and a lanthanide. In this way, etching damage to the gate insulating layer 15 may be prevented such that the gate insulating layer 15 may be protected from film thinning and good insulating properties may be maintained. As a result, a field effect transistor having good electric characteristics may be obtained.

Second Embodiment Modification

As example modifications of the second embodiment, field effect transistors having configurations other than the top-gate/bottom-contact configuration will be described. Note that in the following descriptions of example modifications of the second embodiment, descriptions of features and elements that are substantially identical to those of the previously described embodiments may be omitted.

Figure 17:
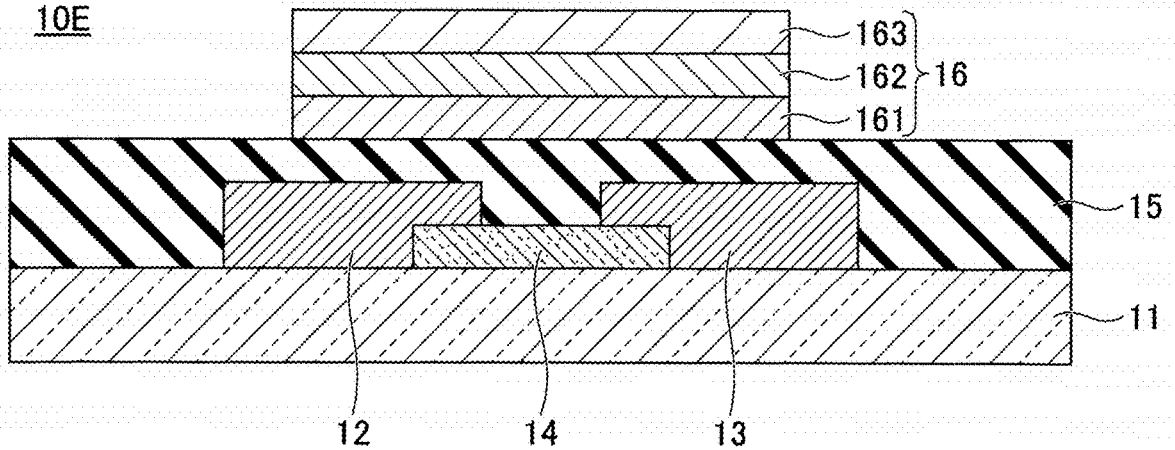
FIG. 17 is a cross-sectional view of a field effect transistor according to a first example modification of the second embodiment.
Figure 18:
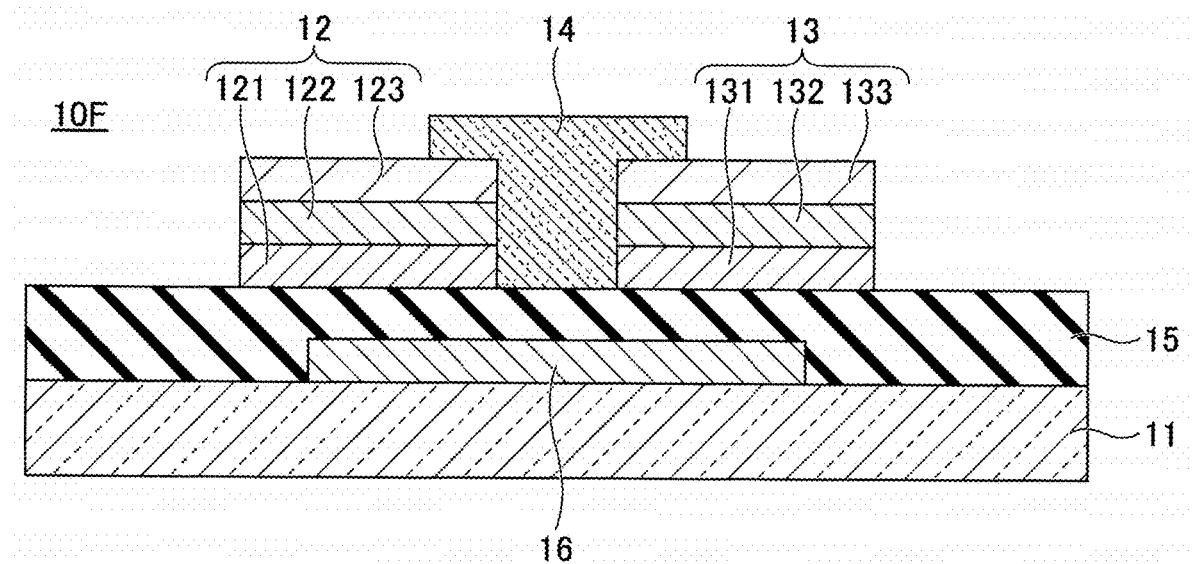
FIG. 18 is a cross-sectional view of a field effect transistor according to a second example modification of the second embodiment.
Figure 19:
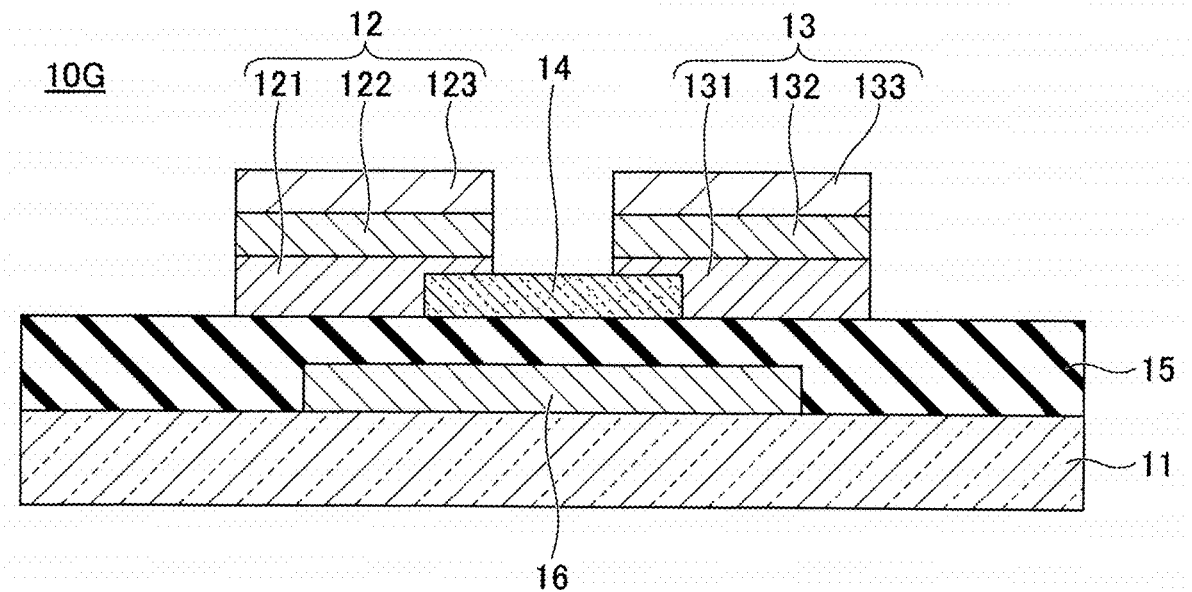
FIG. 19 is a cross-sectional view of a field effect transistor according to a third example modification of the second embodiment.

FIGS. 17-19 are cross-sectional views of field effect transistors according to example modifications of the second embodiment. Each of the field effect transistors illustrated in FIGS. 17-19 is a representative example of a semiconductor device according to an embodiment of the present invention.

The field effect transistor 10E illustrated in FIG. 17 is a top-gate/top-contact field effect transistor. The field effect transistor 10E differs from the field effect transistor 10A according to an example modification of the first embodiment (see FIG. 9) in that the gate electrode 16 is made of a laminated film having the metal films 162 and 163 sequentially laminated on the metal film 161.

The field effect transistor 10E can be manufactured by altering the execution order of the process step illustrated in FIG. 2 and the process step illustrated in FIG. 3.

The field effect transistor 10F illustrated in FIG. 18 is a bottom-gate/bottom-contact field effect transistor. The field effect transistor 10F differs from the field effect transistor 10B according to an example modification of the first embodiment (see FIG. 10) in that the source electrode 12 is made of a laminated film having the metal films 122 and 123 sequentially laminated on the metal film 121, and the drain electrode 13 is made of a laminated film having the metal film 132 and 133 sequentially laminated on the metal film 131. Note that the materials and film forming methods used for the metal films 123 and 133 may be the same as the material and film forming method used for the metal film 163, for example.

The field effect transistor 10G illustrated in FIG. 19 is a bottom-gate/top-contact field effect transistor. The field effect transistor 10G differs from the field effect transistor 100 according to an example modification of the first embodiment (see FIG. 11) in that the source electrode 12 is made of a laminated film having the metal films 122 and 123 sequentially laminated on the metal film 121, and the drain electrode 13 is made of a laminated film having the metal film 132 and the metal film 133 sequentially laminated on the metal film 131. Note that the materials and film forming methods used for the metal films 123 and 133 may be the same as the material and the film forming method used for the metal film 163, for example.

As described above, the layer configuration of the field effect transistor according to the present invention is not particularly limited, and a suitable configuration may be selected from the configurations illustrated in FIG. 12 and FIGS. 17-19 according to the purpose, for example. Note that the field effect transistors 10E, 10F, and 10G illustrated in FIGS. 17-19 may achieve effects similar to those of the field effect transistor 10D.

Third Embodiment

According to a third embodiment of the present invention, the field effect transistor according to the second embodiment is manufactured by laminating a second conductive film that dissolves in an organic alkaline solution on a first conductive film to form the gate electrode. Note that in the following description of the third embodiment, descriptions of features and elements that are substantially identical to those of the previously described embodiments may be omitted.

The configuration of the field effect transistor according to the third embodiment may be the same as that of the field effect transistor 10D as illustrated in FIG. 12. In the third embodiment, the material of the metal film 162 is not particularly limited and may be suitably selected according to the purpose as long as it is a metal, an alloy, or a mixture of a plurality of metals that can be etched by an etching solution made of an organic alkaline solution. For example, copper (Cu), a Cu alloy (an alloy primarily containing Cu), and the like can be used as the material of the metal film 162.

Note, however, that the metal film 162 may be replaced by a conductive film other than a metal film (e.g., conductive oxide film) as long as it can be etched with an etching solution made of an organic alkaline solution.

The metal film 163 is preferably made of a metal having higher heat resistance than the metal film 162. In this way, the upper surface of the gate electrode 16 (the upper surface of the metal film 163) may be prevented from being roughened when the field effect transistor 10D is annealed. For example, if the metal film 162 is made of Cu, Ti can be used as the metal film 163.

Note that in the process of manufacturing the field effect transistor 10D according to the third embodiment, the process step illustrated in FIG. 15 does not have to be implemented.

That is, after implementing the process step illustrated in FIG. 14, the metal films 161 and 162 may be simultaneously etched and removed from a region not covered by the metal film 163. In this step, an organic alkaline solution is used as the etching solution. The resist layer 300 is soluble in the organic alkaline solution. On the other hand, the metal film 163 has etching resistance to the organic alkaline solution. Thus, even if the resist layer 300 is dissolved, the metal films 161 and 162 can be simultaneously etched into a desired shape using the metal film 163 as a mask (FIG. 16). Note that although the resist layer 300 dissolves gradually, FIG. 16 shows a state in which the resist layer 300 is completely dissolved.

As described above, according to the process of manufacturing the field effect transistor 10D according to the third embodiment, because the resist layer 300 may be completely dissolved in the process step illustrated in FIG. 16, a separate step for removing the resist layer 300 does not have to be implemented. In this way, the process of manufacturing the field effect transistor 10D may be simplified, and manufacturing costs of the field effect transistor 10D may be reduced.

Note, however, that because the metal film 163 functions as an etching mask in the process step illustrated in FIG. 16, for example, after executing the process step illustrated in FIG. 14, the resist layer 300 may be removed beforehand, and the metal films 161 and 162 may be simultaneously etched using the metal mask 163 as an etching mask thereafter. Through the above-described process steps, the gate electrode 16 made of a laminated film having the metal films 162 and 163 sequentially laminated on the metal film 161 may be formed, and the process of manufacturing the top-gate/bottom-contact field effect transistor 10D (see FIG. 16) may be completed.

Note that in some cases, after the process step of FIG. 16 (sometimes not immediately after the process step of FIG. 16), an annealing process (e.g., at about 300° C. to 400° C.) may be performed on the field effect transistor 10D in order to improve the reliability of the active layer 14 that is made of an oxide semiconductor. In this case, the surface of the gate electrode 16 may be roughened by the annealing process, and the gate electrode 16 may not adequately function as an electrode. However, in the third embodiment, the metal film 163 corresponding to the uppermost layer of the gate electrode 16 is made of a metal (e.g., Ti) having higher heat resistance than the metal film 162 (e.g., Cu), and in this way, the surface of the gate electrode 16 may be prevented from roughening.

As described above, according to the third embodiment, a laminated film having the metal films 162 and 163 sequentially laminated on the metal film 161 is provided as the electrode formed on a predetermined surface of the gate insulating layer 15 made of an oxide film. The metal films 161 and 162 are made of a metal, an alloy or a mixture of a plurality of metals that can be etched with an etching solution made of an organic alkaline solution.

Also, the metal film 163 is made of a metal, an alloy, or a mixture of a plurality of metals that has etching resistance to an organic alkaline solution and can be etched by a predetermined etching solution at a higher etch rate as compared with the etch rate for the metal film 162.

Thus, the metal film 163 may function as a mask when the metal films 161 and 162 are etched with an organic alkaline solution. In this way, the metal films 161 and 162 may be simultaneously etched into a desired shape.

Also, the organic alkali solution can selectively etch the metal films 161 and 162 with respect to the gate insulating layer 15 that is made of an oxide film containing element A, which is an alkaline earth metal, and element B, which is at least one element selected from a group consisting of Ga, Sc, Y, and a lanthanide. In this way, etching damage to the gate insulating layer 15 may be prevented such that the gate insulating layer 15 may be protected from film thinning and good insulating properties may be maintained. As a result, a field effect transistor having good electric characteristics may be obtained.

Examples 1-4

In Examples 1-4, the top-gate/bottom-contact field effect transistor 10 as illustrated in FIG. 1 was manufacture in the following manner.

First, a metal film (Au) was formed on the base material 11 that is made of glass, and the metal film was patterned through photolithography and wet etching to form the source electrode 12 and the drain electrode 13. Thereafter, an oxide semiconductor film ($MgIn_2O_4$) was formed over the source electrode 12 and the drain electrode 13, and the oxide semiconductor film was patterned through photolithography and wet etching to form the active layer 14.

Then, a coating solution for forming an oxide film covering the source electrode 12, the drain electrode 13, and the active layer 14 was spin-coated on the base material 11, after which the spin-coated film was subjected to a drying process, a firing process, and an annealing process to form the gate insulating layer 15 (LaSrO).

Then, the metal film 161 was formed on the gate insulating layer 15 by sputtering an Al alloy containing Al as a main component (target material: SA-HT2 manufactured by Kobelco Research Institute) on the gate insulating layer. Then, the metal film 162 was formed on the metal film 161 by sputtering Mo (Examples 1 and 2) or Cu (Examples 3 and 4) on the metal film 161. Then, the resist layer 300 was formed over a predetermined region on the metal film 162 through photolithography.

Then, etching step 1 and etching step 2 were implemented to form the gate electrode 16 made of the metal film 161 and the metal film 162, and the manufacture of the field effect transistor 10 was completed. Table 1 below indicates the conditions of the etching step 1 and the etching step 2 in Examples 1-4.

TABLE 1

| | EXAMPLE 1 | | EXAMPLE 2 | | EXAMPLE 3 | | EXAMPLE 4 | |
|---|---|---|---|---|---|---|---|---|
| ETCHING STEP 1 (ETCH RATE nm/min) | METAL FILM 161 (Al) 1.6 | METAL FILM 162 (Mo) 437.7 | METAL FILM 161 (Al) 21 | METAL FILM 162 (Mo) 200 | METAL FILM 161 (Al) 1 | METAL FILM 162 (Cu) 400 | METAL FILM 161 (Al) 1.6 | METAL FILM 162 (Cu) 407 |
| ETCHING STEP 2 (ETCH RATE nm/min) | GATE INSULATING LAYER 15 NO FILM THINNING | METAL FILM 161 (Al) 66.7 | GATE INSULATING LAYER 15 NO FILM THINNING | METAL FILM 161 (Al) 66.7 | GATE INSULATING LAYER 15 NO FILM THINNING | METAL FILM 161 (Al) 66.7 | GATE INSULATING LAYER 15 NO FILM THINNING | METAL FILM 161 (Al) 66.7 |

Specifically, in Example 1, etching step 1 was implemented using an etching solution having etch rates of 1.6 nm/min and 437.7 nm/min for the metal film 161 and the metal film 162, respectively, to etch the metal film 162 and form a pattern. Also, etching step 2 was implemented using an etching solution made of a 6%-concentration tetramethylammonium hydroxide solution having an etch rate of 66.7 nm/min for the metal film 161 to etch the metal film 161 and form a pattern.

In Example 2, etching step 1 was implemented using an etching solution having etch rates of 21 nm/min and 200 nm/min for the metal film 161 and the metal film 162, respectively, to etch the metal film 162 and form a pattern. Also, etching step 2 was implemented using an etching solution made of a 6%-concentration tetramethylammonium hydroxide solution having an etch rate of 66.7 nm/min for the metal film 161 to etch the metal film 161 and form a pattern.

In Example 3, etching step 1 was implemented using an etching solution having etch rates of 1 nm/min and 400 nm/min for the metal film 161 and the metal film 162, respectively, to etch the metal film 162 and form a pattern. Also, etching step 2 was implemented using an etching solution made of a 6%-concentration tetramethylammonium hydroxide solution having an etch rate of 66.7 nm/min for the metal film 161 to etch the metal film 161 and form a pattern.

In Example 4, etching step 1 was implemented using an etching solution having etch rates of 1.6 nm/min and 407 nm/min for the metal film 161 and the metal film 162, respectively, to etch the metal film 162 and form a pattern. Also, etching step 2 was implemented using an etching solution made of a 6%-concentration tetramethylammonium hydroxide solution having an etch rate of 66.7 nm/min for the metal film 161 to etch the metal film 161 and form a pattern.

(Visual Inspection)

After implementing etching step 2 in Examples 1-4, etching damage to the gate insulating layer 15 was inspected (to determine whether film thinning of the gate insulating layer 15 has occurred). The results of the inspection are indicated in Table 1.

As can be appreciated from Table 1, by etching the metal film 162 in etching step 1, and etching the metal film 161 using the metal film 162 as a mask in etching step 2, damage to the oxide film constituting the gate insulating layer 15 by the etching solution (film thinning of the gate insulating layer 15) could be prevented.

(Electrical Characteristics)

With respect to the field effect transistor obtained in Example 1, transistor performance evaluation was carried out using a semiconductor parameter analyzer apparatus (semiconductor parameter analyzer B1500 manufactured by Agilent Technologies, Inc.). Specifically, the source/drain current (Ids) and the gate current (|Ig|) were measured while the source/drain voltage (Vds) was set to 10 V and the gate voltage (Vg) was changed within a range from −15 V to +15 V, and the current-voltage characteristics were evaluated.

Figure 20:
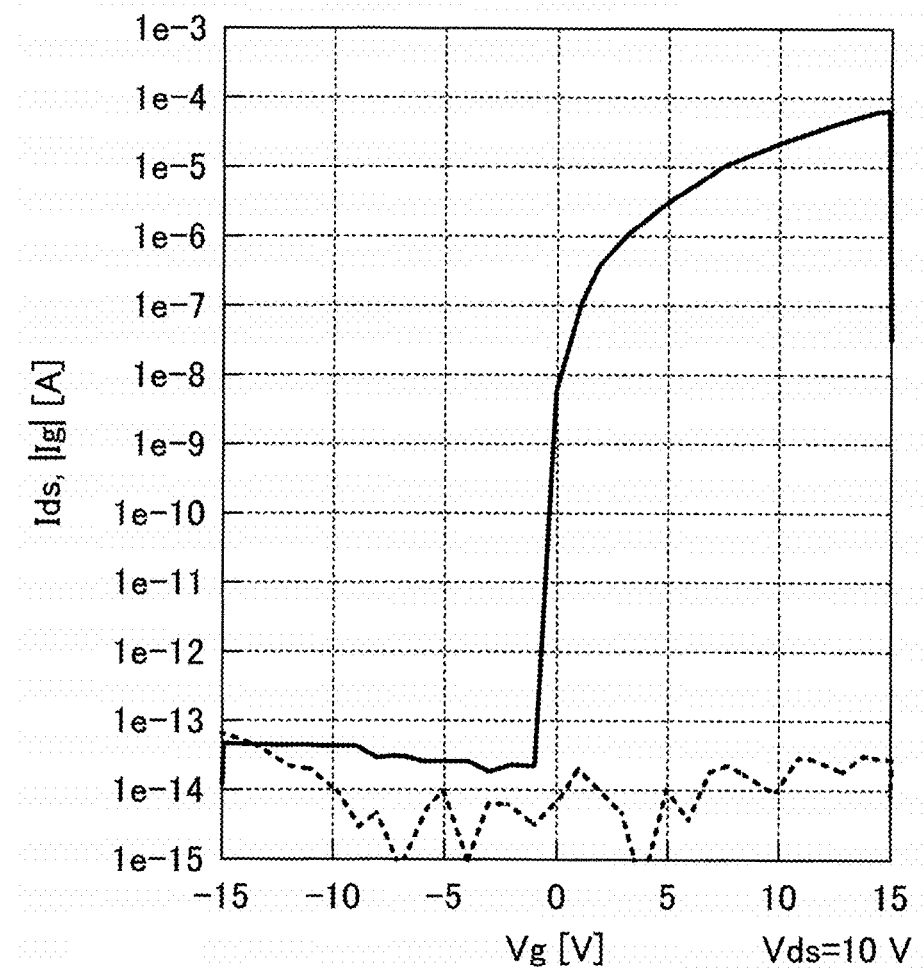
FIG. 20 is a graph representing characteristics of a field effect transistor manufactured in Example 1.

As can be appreciated from FIG. 20, which indicates the results of the transistor performance evaluation, insulating properties were maintained and good transistor characteristics were obtained.

Examples 5-8

In Examples 5-8, the top-gate/bottom-contact field effect transistor 10D as illustrated in FIG. 12 was manufactured in the following manner.

First, as in Example 1, the source electrode 12 (Au) and the drain electrode 13 (Au), the active layer 14 ($MgIn_2O_4$), and the gate insulating layer 15 (LaSrO) were formed on the base material 11 made of glass.

Then, the metal film 161 was formed on the gate insulating layer 15 by sputtering an Al alloy containing Al as a main component (target material: SA-HT2 manufactured by Kobelco Research Institute) on the gate insulating layer 15. Then, the metal film 162 was formed on the metal film 161 by sputtering Mo (Examples 5, 6) or Cu (Examples 7, 8) on the metal film 161. Then, the metal film 163 was formed on the metal film 162 by sputtering Ti on the metal film 162. Thereafter, the resist layer 300 was formed over a predetermined region on the metal film 163 through photolithography.

Then, etching step 1, etching step 2, and etching step 3 were implemented to form the gate electrode 16 made of the metal films 161, 162, and 163, and the manufacture of the field effect transistor 10D was completed. Table 2 below indicates the conditions of etching step 1, etching step 2, and etching step 3 in Examples 5-8.

TABLE 2

| | EXAMPLE 5 | | EXAMPLE 6 | | EXAMPLE 7 | | EXAMPLE 8 | |
|---|---|---|---|---|---|---|---|---|
| ETCHING STEP 1 (ETCH RATE nm/min) | METAL FILM 162 (Mo) <0.1 | METAL FILM 163 (Ti) 138 | METAL FILM 162 (Mo) <0.1 | METAL FILM 163 (Ti) 138 | METAL FILM 162 (Cu) 0.3 | METAL FILM 163 (Ti) 138 | METAL FILM 162 (Cu) 0.3 | METAL FILM 163 (Ti) 138 |
| ETCHING STEP 2 (ETCH RATE nm/min) | METAL FILM 161 (Al) 1.6 | METAL FILM 162 (Mo) 437.7 | METAL FILM 161 (Al) 21 | METAL FILM 162 (Mo) 200 | METAL FILM 161 (Al) 1 | METAL FILM 162 (Cu) 400 | METAL FILM 161 (Al) 1.6 | METAL FILM 162 (Cu) 407 |
| ETCHING STEP 3 (ETCH RATE nm/min) | GATE INSULATING LAYER 15 NO FILM THINNING | METAL FILM 161 (Al) 66.7 | GATE INSULATING LAYER 15 NO FILM THINNING | METAL FILM 161 (Al) 66.7 | GATE INSULATING LAYER 15 NO FILM THINNING | METAL FILM 161 (Al) 66.7 | GATE INSULATING LAYER 15 NO FILM THINNING | METAL FILM 161 (Al) 66.7 |

Specifically, in Example 5, etching step 1 was implemented using an etching solution having etch rates of <0.1 nm/min and 138 nm/min for the metal film 162 and the metal film 163, respectively, to etch the metal film 163 and form a pattern. Also, etching step 2 was implemented using an etching solution having etch rates of 1.6 nm/min and 437.7 nm/min for the metal film 161 and the metal film 162, respectively, to etch the metal film 162 and form a pattern. Also, etching step 3 was implemented using an etching solution made of a 6%-concentration tetramethylammonium hydroxide solution having an etch rate of 66.7 nm/min for the metal film 161 to etch the metal film 161 and form a pattern.

In Example 6, etching step 1 was implemented using an etching solution having etch rates of <0.1 nm/min and 138 nm/min for the metal film 162 and the metal film 163, respectively, to etch the metal film 163 and form a pattern. Also, etching step 2 was implemented using an etching solution having etch rates of 21 nm/min and 200 nm/min for the metal film 161 and the metal film 162, respectively, to etch the metal film 162 and form a pattern. Also, etching step 3 was implemented using an etching solution made of a 6%-concentration tetramethylammonium hydroxide solution having an etch rate of 66.7 nm/min for the metal film 161 to etch the metal film 161 and form a pattern.

In Example 7, etching step 1 was implemented using an etching solution having etch rates of 0.3 nm/min and 138 nm/min for the metal film 162 and the metal film 163, respectively, to etch the metal film 163 and form a pattern. Also, etching step 2 was implemented using an etching solution having etch rates of 1 nm/min and 400 nm/min for the metal film 161 and the metal film 162, respectively, to etch the metal film 162 and form a pattern. Also, etching step 3 was implemented using an etching solution made of a 6%-concentration tetramethylammonium hydroxide solution having an etch rate of 66.7 nm/min for the metal film 161 to etch the metal film 161 and form a pattern.

In Example 8, etching step 1 was implemented using an etching solution having etch rates of 0.3 nm/min and 138 nm/min for the metal film 162 and the metal film 163, respectively, to etch the metal film 163 and form a pattern. Also, etching step 2 was implemented using an etching solution having etch rates of 1.6 nm/min and 407 nm/min for the metal film 161 and the metal film 162, respectively, to etch the metal film 162 and form a pattern. Also, etching step 3 was implemented using an etching solution made of a 6%-concentration tetramethylammonium hydroxide solution having an etch rate of 66.7 nm/min for the metal film 161 to etch the metal film 161 and form a pattern.

(Visual Inspection)

After implementing etching step 3 in Examples 5-8, etching damage to the gate insulating layer 15 was inspected (to determine whether film thinning of the gate insulating layer 15 has occurred). The results of the inspection are indicated in Table 2.

As can be appreciated from Table 2, by etching the metal film 162 in etching step 2 and etching the metal film 161 using the metal films 162 and 163 as masks in etching step 3, damage to the oxide film constituting the gate insulating layer 15 by the etching solution (film thinning of the gate insulating layer 15) can be prevented.

(Electrical Characteristics)

With respect to the field effect transistor obtained in Example 5, transistor performance evaluation was carried out in the same manner as in Example 1. The evaluation results were similar to those of FIG. 20, indicating that insulating properties were maintained and good transistor characteristics were obtained.

Comparative Example 1

In Comparative Example 1, the top-gate/bottom-contact field effect transistor 10D as illustrated in FIG. 12 was manufactured in the following manner.

Note that in Comparative Example 1, etching step 1 was implemented using an etching solution having etch rates of <0.1 nm/min and 138 nm/min for the metal film 162 and the metal film 163, respectively, to etch the metal film 163 and form a pattern. However, etching step 2 was not implemented. Also, etching step 3 was implemented using a PAN (phosphoric acid, acetic acid, and nitric acid) based etching solution, which is widely used for metal films made of Al and Mo, to form a pattern.

(Visual Inspection)

After implementing etching step 3 in Comparative Example 1, etching damage to the gate insulating layer 15 was inspected (to determine whether film thinning of the gate insulating layer 15 has occurred). The results of the inspection are indicated in Table 3.

TABLE 3

| | COMPARATIVE EXAMPLE 1 | | |
|---|---|---|---|
| ETCHING STEP 1 (ETCH RATE nm/min) | METAL FILM 162 (Mo) <0.1 | METAL FILM 163 (Ti) 138 | |
| ETCHING STEP 2 (ETCH RATE nm/min) | NOT IMPLEMENTED | | |
| ETCHING STEP 3 (ETCH RATE nm/min) | GATE INSULATING LAYER 15 FILM THINNED | METAL FILM 161 (Al) 88 | METAL FILM 162 (Mo) 316 |

As can be appreciated from Table 3, when etching step 3 was implemented using a PAN based etching solution to form a pattern without implementing etching step 2, film thinning occurred at the oxide film constituting the gate insulating layer 15. That is, it was confirmed that damage to the oxide film constituting the gate insulating layer 15 by the etching solution occurred when etching according to the Comparative Example is implemented.

Examples 9 and 10

In Examples 9 and 10, the top-gate/bottom-contact field effect transistor 10D as illustrated in FIG. 12 was manufactured in the following manner.

First, as in Example 1, the source electrode 12 (Au) and the drain electrode 13 (Au), the active layer 14 (MgIn$_2$O$_4$), and the gate insulating layer 15 (LaSrO) were formed on the base material 11 made of glass.

Then, the metal film 161 was formed on the gate insulating layer 15 by sputtering an Al alloy containing Al as a main component (target material: SA-HT2 manufactured by Kobelco Research Institute) on the gate insulating layer 15. Then, the metal film 162 was formed on the metal film 161 by sputtering Cu on the metal film 161. Then, the metal film 163 was formed on the metal film 162 by sputtering Ti on the metal film 162. Thereafter, the resist layer 300 was formed over a predetermined region on the metal film 163 through photolithography.

Then, etching step 1 and etching step 2 were implemented to form the gate electrode 16 made of the metal films 161, 162, and 163, and the manufacture of the field effect transistor 10D was completed. Table 4 below indicates the conditions of etching step 1 and the etching step 2 in Examples 9 and 10.

Specifically, in Example 9, etching step 1 was implemented using an etching solution having etch rates of 0.3 nm/min and 138 nm/min for the metal film 162 and the metal film 163, respectively, to etch the metal film 163 and form a pattern. Also, etching step 2 was implemented using an etching solution made of an etching solution made of a 6%-concentration tetramethylammonium hydroxide solution that has an etch rate of 66.7 nm/min for the metal film 161 and is also capable of dissolving the metal film 162 such that the metal films 161 and 162 would be simultaneously etched to form a pattern.

In Example 10, etching step 1 was implemented using an etching solution having etch rates of 0.6 nm/min and 117.6 nm/min for the metal film 162 and the metal film 163, respectively, to etch the metal film 163 and form a pattern. Also, etching step 2 was implemented using an etching solution made of an etching solution made of a 6%-concentration tetramethylammonium hydroxide solution that has an etch rate of 66.7 nm/min for the metal film 161 and is also capable of dissolving the metal film 162 such that the metal films 161 and 162 would be simultaneously etched to form a pattern.

(Visual Inspection)

After implementing etching step 2 in Examples 9 and 10, etching damage to the gate insulating layer 15 was inspected (to determine whether film thinning of the gate insulating layer 15 has occurred). The results of the inspection are indicated in Table 4.

As can be appreciated from Table 4, by etching the metal film 163 in etching step 1 and simultaneously etching the metal films 161 and 162 using the metal film 163 as a mask in etching step 2, damage to the oxide film constituting the gate insulating layer 15 by the etching solution (film thinning of the gate insulating layer 15) can be prevented.

TABLE 4

| | EXAMPLE 9 | | | EXAMPLE 10 | | |
|---|---|---|---|---|---|---|
| ETCHING STEP 1 (ETCH RATE nm/min) | METAL FILM 162 (Cu) 0.3 | METAL FILM 163 (Ti) 138 | | METAL FILM 162 (Cu) 0.6 | METAL FILM 163 (Ti) 117.6 | |
| ETCHING STEP 2 (ETCH RATE nm/min) | GATE INSULATING LAYER 15 NO FILM THINNING | METAL FILM 161 (Al) 66.7 | METAL FILM 162 (Cu) DISSOLVED | GATE INSULATING LAYER 15 NO FILM THINNING | METAL FILM 161 (Al) 66.7 | METAL FILM 162 (Cu) DISSOLVED |

(Electrical Characteristics)

With respect to the field effect transistor obtained in Example 9, transistor performance evaluation was carried out in the same manner as in Example 1. The evaluation results were similar to those shown in FIG. 20, indicating that insulating properties were maintained and good transistor characteristics were obtained.

Comparative Example 2

In Comparative Example 2, the top-gate/bottom-contact field effect transistor 10D as illustrated in FIG. 12 was manufactured in the following manner.

Note that in Comparative Example 2, etching step 1 was implemented using an etching solution having etch rates of 0.3 nm/min and 138 nm/min for the metal film 162 and the metal film 163, respectively, to etch the metal film 163 and form a pattern. Also, etching step 2 was implemented to form a pattern using an etching solution made of a mixed solution of sulfuric acid, nitric acid, and ammonium fluoride that can dissolve metal films of Al and Cu.

(Visual Inspection)

After implementing etching step 2 in Comparative Example 2, etching damage to the gate insulating layer 15 was inspected (to determine whether film thinning of the gate insulating layer 15 has occurred). The results of the inspection are indicated in Table 5.

TABLE 5

| | COMPARATIVE EXAMPLE 2 | | |
|---|---|---|---|
| ETCHING STEP 1 (ETCH RATE nm/min) | METAL FILM 162 (Cu) 0.3 | METAL FILM 163 (Ti) 138 | |
| ETCHING STEP 2 (ETCH RATE nm/min) | GATE INSULATING LAYER 15 FILM THINNED | METAL FILM 161 (Al) 112.5 | METAL FILM 162 (Cu) 493.2 |

As can be appreciated from Table 5, when a PAN based etching solution was used to form a pattern in etching step 2, film thinning occurred at the oxide film constituting the gate insulating layer 15. That is, it was confirmed that damage to the oxide film constituting the gate insulating layer 15 by the etching solution occurred when etching according to Comparative Example 2 was implemented.

Fourth Embodiment

As example aspects of a fourth embodiment of the present invention, a display element, an image display device, and a system using the field effect transistor according to the first embodiment will be described. In the following description of the fourth embodiment, descriptions of features and elements that are substantially the same as those of the previously described embodiments may be omitted.

(Display Element)

The display element according to the fourth embodiment includes at least a light control element and a drive circuit for driving the light control element. The display element may further include other components as necessary. The light control element is not particularly limited and may be suitably selected according to the purpose as long as it is an element that is controlled to output light based on a drive signal. Examples of the light control element include an electroluminescence (EL) element, an electrochromic (EC) element, a liquid crystal element, an electrophoretic element, an electrowetting element, and the like.

The drive circuit is not particularly limited and may be suitably selected according to the purpose as long as it includes the field effect transistor according to the first embodiment. The other components of the display element are not particularly limited and may be suitably selected according to the purpose.

Because the display element according to the fourth embodiment includes the field effect transistor according to the first embodiment, leakage current in the display element may be reduced and the display element may be driven by a low voltage. As a result, the display element may be capable of high-quality display.

(Image Display Device)

The image display device according to the fourth embodiment includes at least a plurality of the display elements according to the fourth embodiment, a plurality of wirings, and a display control device. The image display device may further include other components as necessary. The plurality of display elements are not particularly limited and may be suitably selected according to the purpose as long as the display elements according to the fourth embodiment are arranged into a matrix.

The plurality of wirings are not particularly limited and may be suitably selected according to the purpose as long as a gate voltage and an image data signal can be individually applied to each of the field effect transistors in the plurality of display elements.

The display control device is not particularly limited and may be suitably selected according to the purpose as long as it is capable of individually controlling the gate voltage and the signal voltage applied to each of the field effect transistors via the plurality of wirings based on image data. The other components of the display device are not particularly limited and may be suitably selected according to the purpose.

Because the image display device according to the fourth embodiment includes the display element including the field effect transistor according to the first embodiment, the image display device may be able to display a high quality image.

(System)

The system according to the fourth embodiment includes at least the image display device according to the fourth embodiment and an image data generating device. The image data generating device generates image data based on image information to be displayed and outputs the image data to the image display device.

Because the system includes the image display device according to the fourth embodiment, the system may be able to display image information with high definition.

In the following, the display element, the image display device, and the system according to the fourth embodiment will be specifically described.

Figure 21:
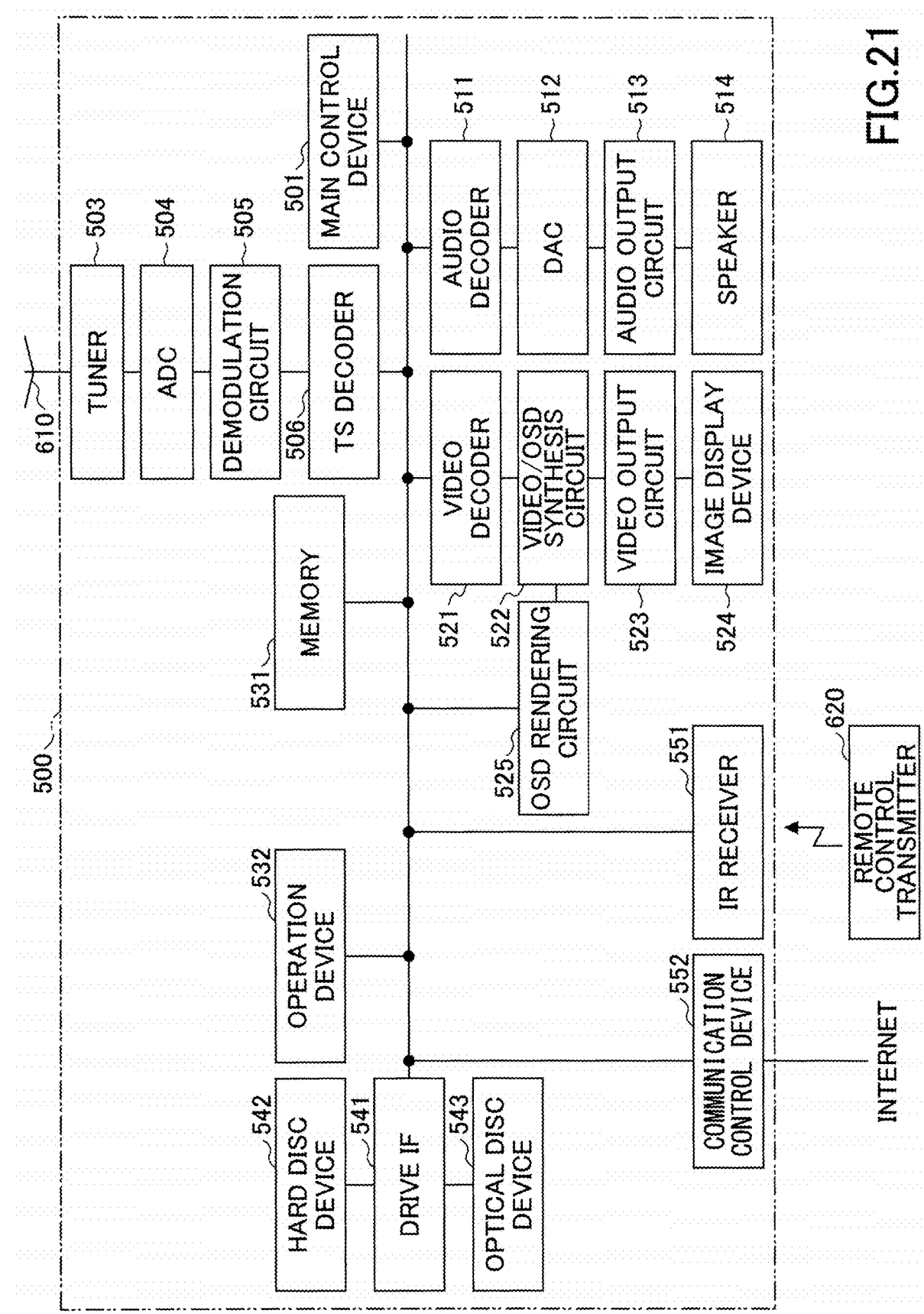
FIG. 21 is a block diagram illustrating a configuration of a television apparatus according to a fourth embodiment of the present invention.

FIG. 21 illustrates a schematic configuration of a television apparatus 500 as an example system according to the fourth embodiment. Note that connection lines in FIG. 21 merely illustrate representative flows of signals or information and do not represent all connections between the various block elements in FIG. 21.

The television apparatus 500 according to the fourth embodiment includes a main control device 501, a tuner 503, an analog to digital converter (ADC) 504, a demodulation circuit 505, a TS (transport stream) decoder 506, an audio decoder 511, a digital to analog converter (DAC) 512, an audio output circuit 513, a speaker 514, a video decoder 521, a video/OSD synthesis circuit 522, a video output circuit 523, an image display device 524, an OSD rendering circuit 525, a memory 531, an operation device 532, a drive interface (drive IF) 541, a hard disk device 542, an optical disk device 543, an IR (infrared) light receiver 551, and a communication control device 552, for example.

The main control device 501 controls the entire television apparatus 500 and includes a CPU, a flash ROM, a RAM, and the like. The flash ROM may stores programs described in code that can be interpreted by the CPU, various data used for processing by the CPU, and the like. Also, the RAM is a working memory used by the CPU.

The tuner 503 selects a broadcast of a preset channel from broadcast waves received by an antenna 610. The ADC 504 converts an output signal (analog information) of the tuner 503 into digital information. The demodulation circuit 505 demodulates the digital information from the ADC 504.

The TS decoder 506 TS-decodes the output signal of the demodulation circuit 505 and separates the audio information and the video information. The audio decoder 511 decodes the audio information from the TS decoder 506. The DA converter (DAC) 512 converts the output signal of the audio decoder 511 into an analog signal.

The audio output circuit 513 outputs the output signal of the DA converter (DAC) 512 to the speaker 514. The video decoder 521 decodes video information from the TS decoder 506. The video/OSD synthesis circuit 522 synthesizes the output signal of the video decoder 521 and the output signal of the OSD rendering circuit 525.

The video output circuit 523 outputs the output signal of the video/OSD synthesis circuit 522 to the image display device 524. The OSD rendering circuit 525 includes a character generator for displaying characters and graphics on a screen of the image display device 524. The OSD rendering circuit 525 outputs a signal including display information in response to an instruction from the operation device 532 or the IR receiver 551.

The memory 531 temporarily stores AV (Audio-Visual) data and the like. The operation device 532 includes an input medium such as a control panel (not shown), and communicates various information input by the user to the main control device 501. The drive IF 541 is a bidirectional communication interface, and may conform to AT Attachment Packet Interface (ATAPI), for example.

The hard disk drive 542 includes a hard disk, a drive device for driving the hard disk, and the like. The drive device records data on the hard disk and reproduces data recorded on the hard disk. The optical disc device 543 records data on an optical disc (e.g., DVD) and reproduces data recorded on the optical disc.

Figure 22:
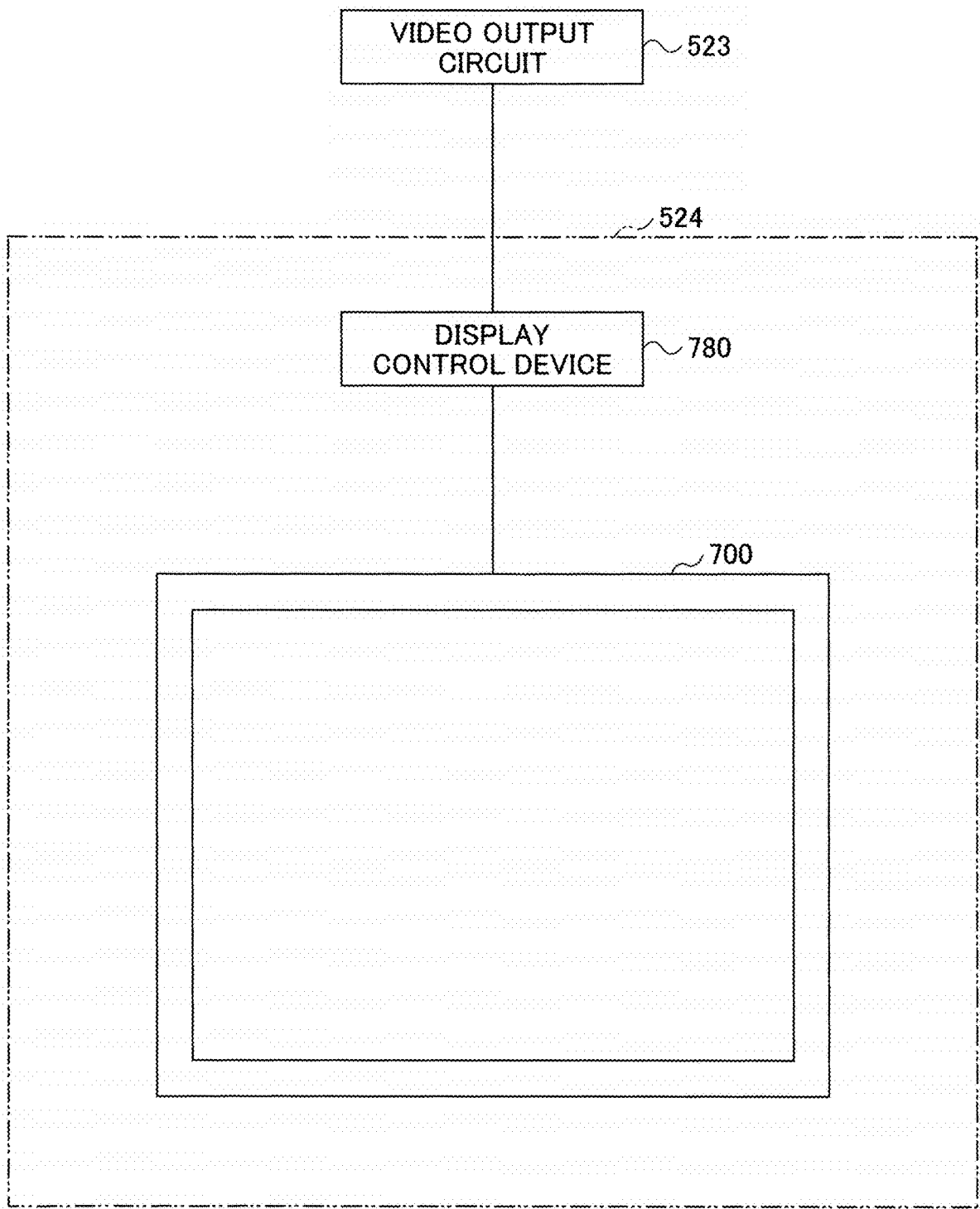
FIG. 22 is a first explanatory diagram of the television apparatus according to the fourth embodiment.
Figure 23:
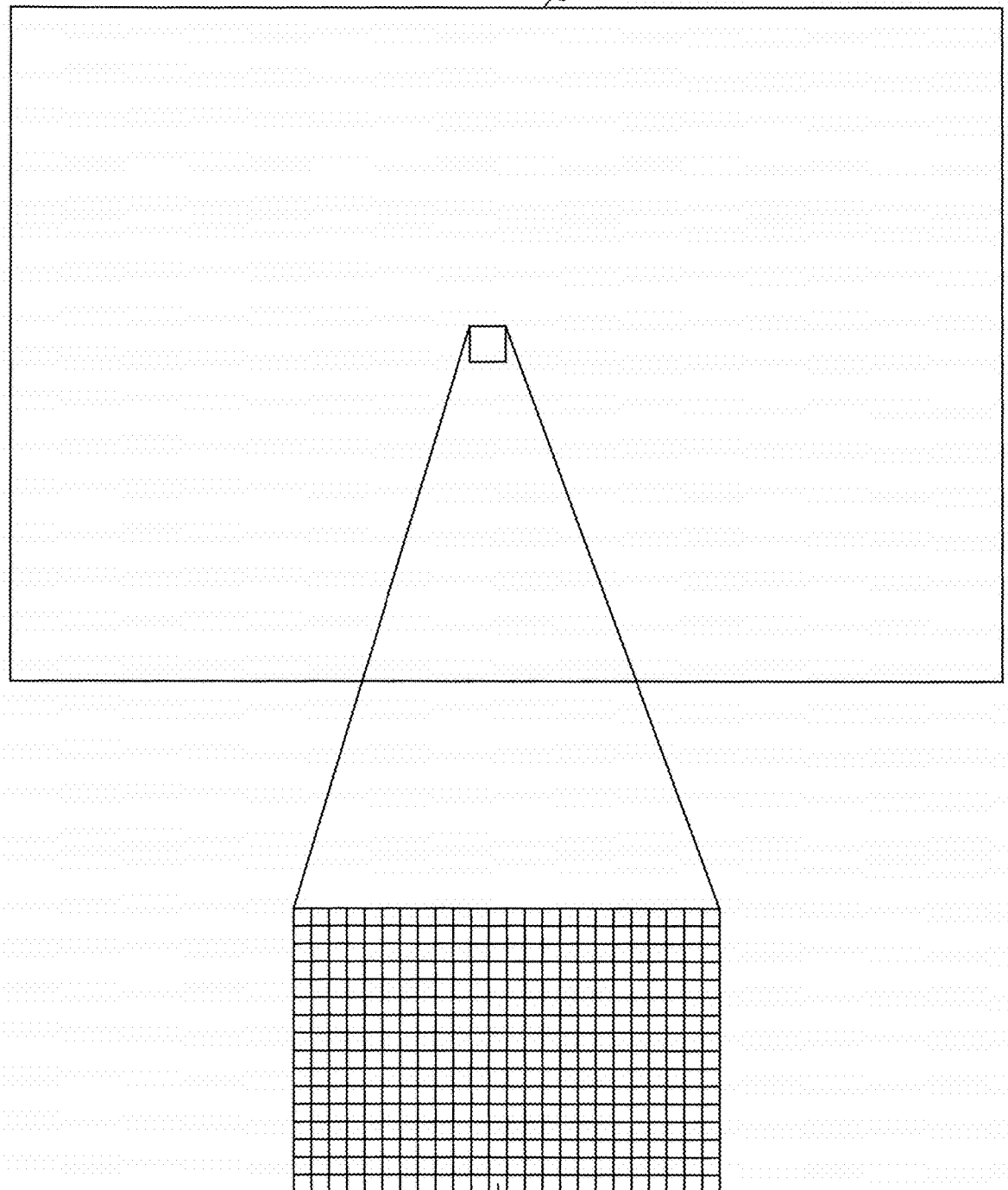
FIG. 23 is a second explanatory diagram of the television apparatus according to the fourth embodiment.

The IR receiver 551 receives an optical signal from a remote control transmitter 620 and communicates the received optical signal to the main control device 501. The communication control device 552 controls communication with the Internet so that various information can be acquired via the Internet. The image display device 524 may include a display unit 700 and a display control device 780 as illustrated in FIG. 22, for example. The display unit 700 may include a display 710 having a plurality of (n×m in the present example) display elements 702 that are arranged into a matrix as illustrated in FIG. 23, for example.

Figure 24:
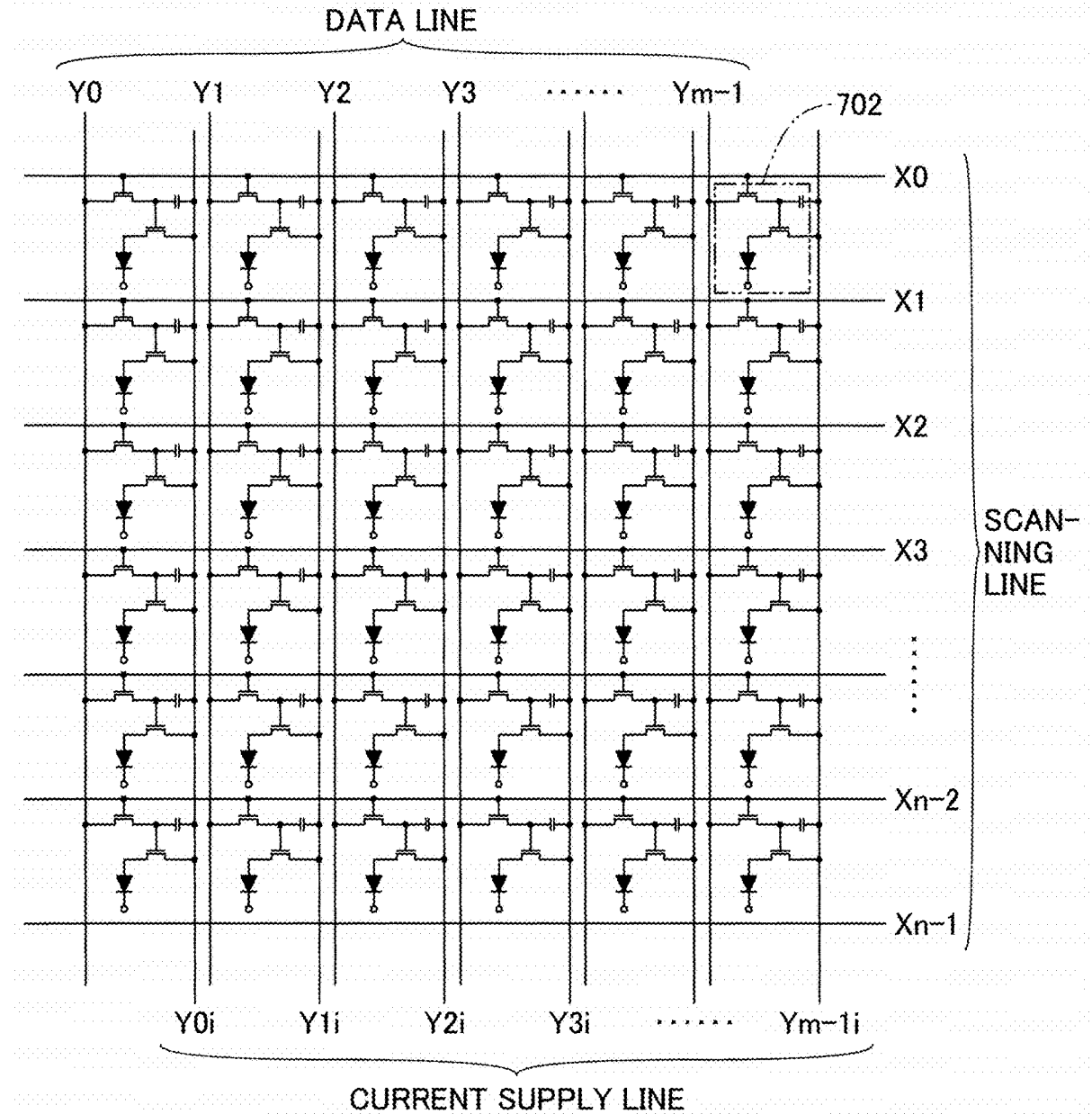
FIG. 24 is a third explanatory diagram of the television apparatus according to the fourth embodiment.

Further, the display 710 may include n scanning lines (X0, X1, X2, X3, ..., Xn−2, Xn−1) arranged at equal intervals along the X-axis direction, m data lines (Y0, Y1, Y2, Y3, ..., Ym−1) arranged at equal intervals along the Y-axis direction, and m power supply lines (Y0i, Y1i, Y2i, Y3i, ..., Ym−1i) arranged at equal intervals along the Y-axis direction as illustrated in FIG. 24, for example. Note that a given display element 702 from among the plurality of display elements 702 can be specified by the scanning line and the data line.

Figure 25:
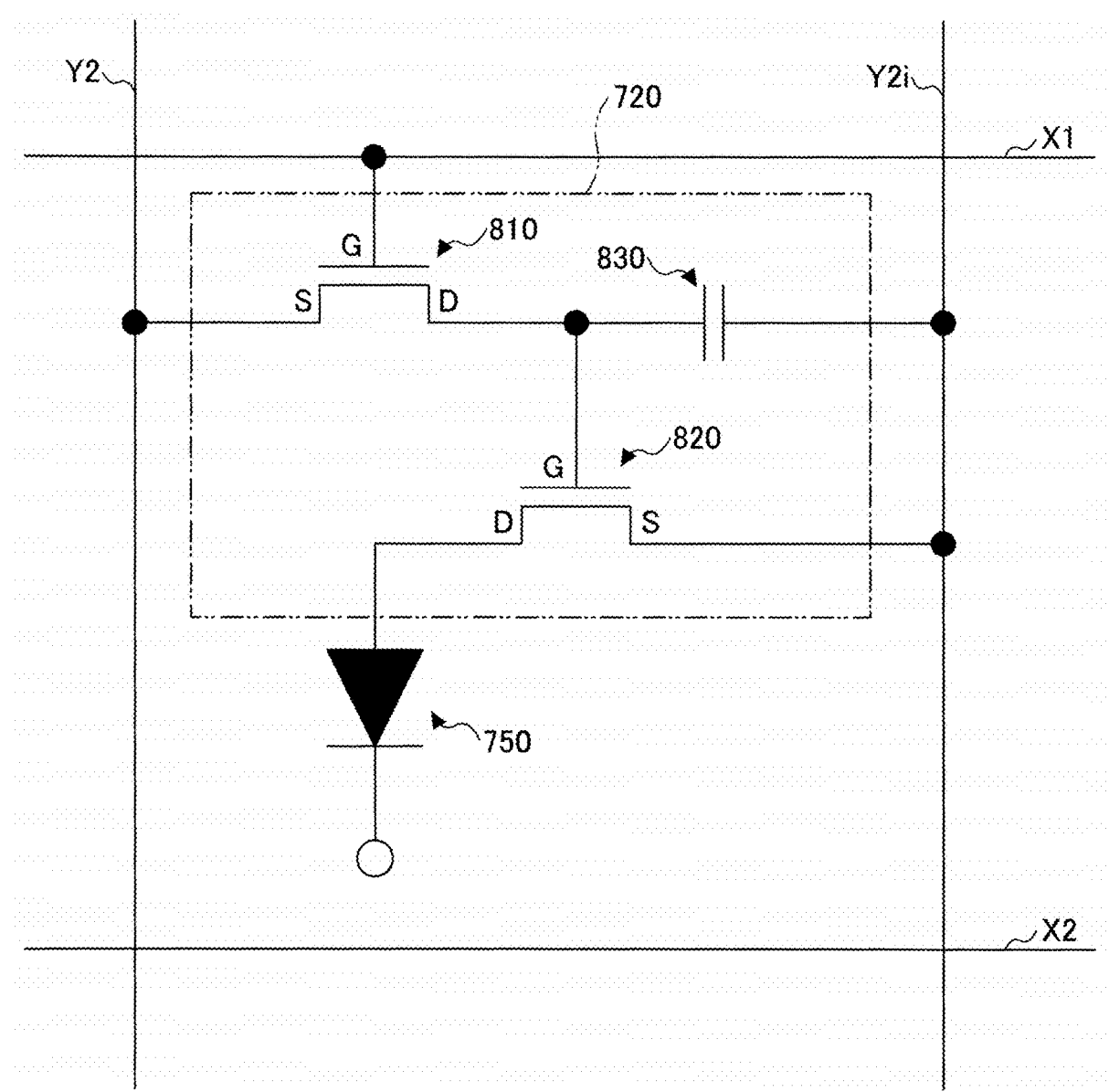
FIG. 25 is an explanatory diagram of a display element of the television apparatus according to the fourth embodiment.

Each display element 702 may include an organic EL (electroluminescence) element 750 and a drive circuit 720 for causing the organic EL element 750 to emit light as illustrated in FIG. 25, for example. That is, the display 710 may be a so-called active matrix organic EL display. Further, the display 710 may be a 32-inch color display, for example. Note, however, that the size of the display 710 is not limited to the above example.

Figure 26:
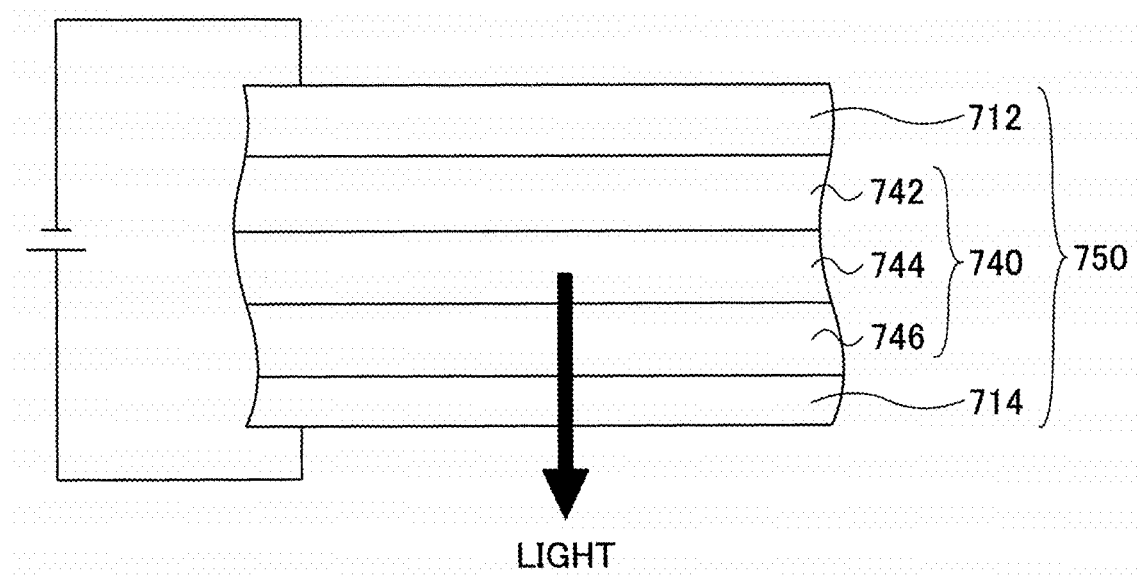
FIG. 26 is an explanatory diagram of an organic electroluminescence element of the television apparatus according to the fourth embodiment.

The organic EL element 750 may include an organic EL thin film layer 740, a cathode 712, and an anode 714, as illustrated in FIG. 26, for example.

The organic EL element 750 may be arranged next to a field effect transistor, for example. In this case, the organic EL element 750 and the field effect transistor can be formed on the same base material. However, the present invention is not limited to such an arrangement. For example, the organic EL element 750 may be arranged on a field effect transistor. In this case, the gate electrode of the field effect transistor needs to be transparent, and as such, a conductive oxide that is transparent, such as ITO (indium tin oxide), $In_2O_3$, $SnO_2$, ZnO, Ga-doped ZnO, Al-dopes ZnO, or Sb-doped $SnO_2$ may be used as the gate electrode, for example.

In the organic EL element 750, Al may be used as the cathode 712, for example. Alternatively, a Mg—Ag alloy, an Al—Li alloy, ITO or the like may be used as the cathode 712, for example. Also, ITO may be used as the anode 714, for example. Alternatively, a conductive oxide such as $In_2O_3$, $SnO_2$, ZnO, a Ag—Nd alloy or the like may be used as the anode 714, for example.

The organic EL thin film layer 740 includes an electron transport layer 742, a light emitting layer 744, and a hole transport layer 746. The cathode 712 is connected to the electron transport layer 742, and the anode 714 is connected to the hole transport layer 746. When a predetermined voltage is applied between the anode 714 and the cathode 712, the light emitting layer 744 emits light.

Also, as illustrated in FIG. 25, the drive circuit 720 includes two field effect transistors 810 and 820 and a capacitor 830. The field effect transistor 810 operates as a switch element. The field effect transistors 810 has a gate electrode G that is connected to a predetermined scanning line, a source electrode S that is connected to a predetermined data line, and a drain electrode D that is connected to one terminal of the capacitor 830.

The capacitor 830 is for storing the state of the field effect transistor 810, i.e., data. The other terminal of the capacitor 830 is connected to a predetermined current supply line.

The field effect transistor 820 is for supplying a large current to the organic EL element 750. The field effect transistor 820 has a gate electrode G that is connected to the drain electrode D of the field effect transistor 810, a drain electrode D that is connected to the anode 714 of the organic EL element 750, and a source electrode S that is connected to a predetermined current supply line.

When the field effect transistor 810 is switched to an "on" state, the organic EL element 750 is driven by the field effect transistor 820.

Figure 27:
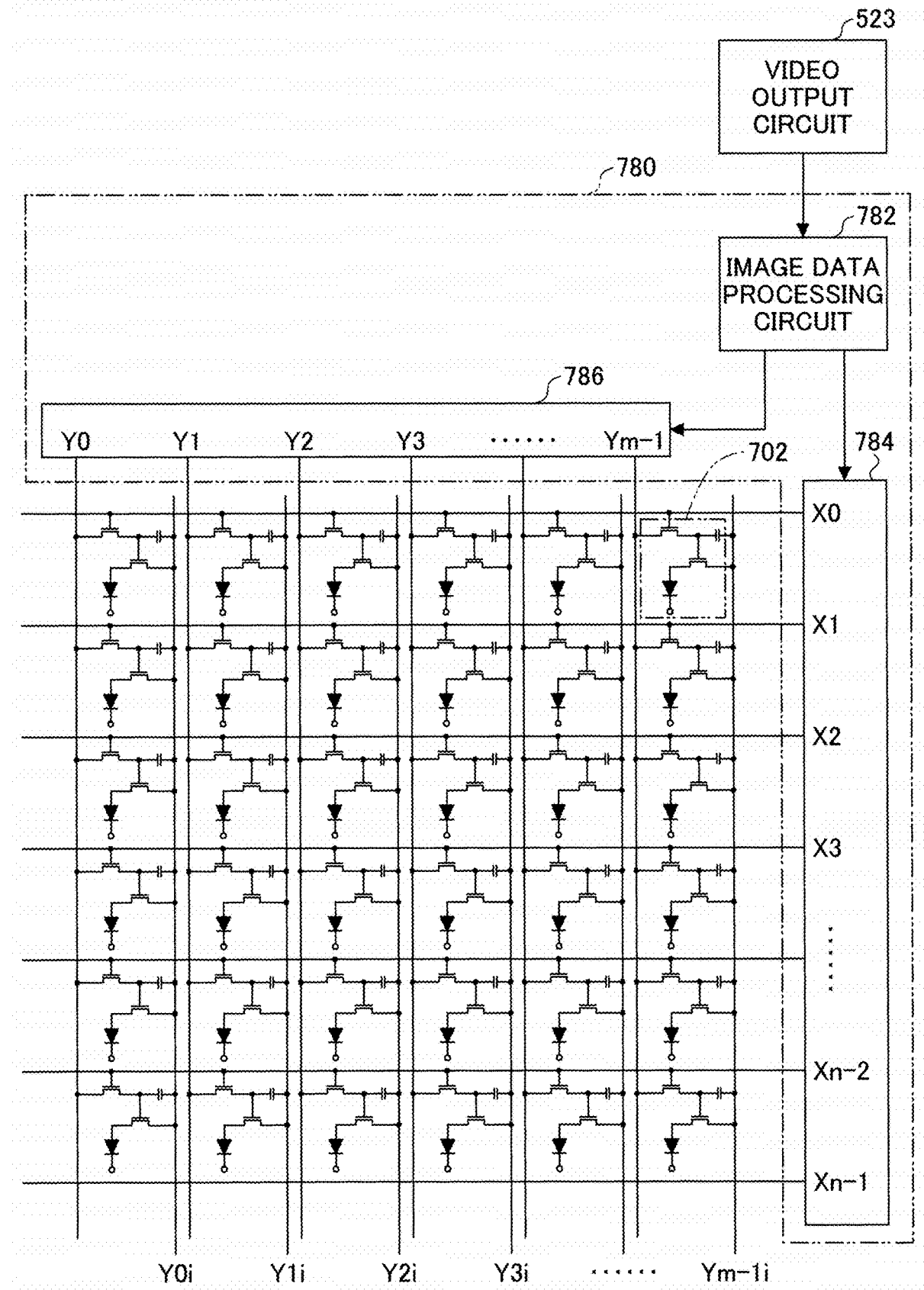
FIG. 27 is a fourth explanatory diagram of the television apparatus according to the fourth embodiment.

The display control device 780 may include an image data processing circuit 782, a scanning line drive circuit 784, and a data line drive circuit 786 as illustrated in FIG. 27, for example.

The image data processing circuit 782 determines the brightness of the plurality of display elements 702 on the display 710 based on the output signal of the video output circuit 523. The scanning line drive circuit 784 individually applies voltages to n scanning lines in response to an instruction from the image data processing circuit 782. The data line drive circuit 786 individually applies voltages to m data lines in response to an instruction from the image data processing circuit 782.

As can be appreciated from the above descriptions, in the television apparatus 500 according to the present embodiment, the video decoder 521, the video/OSD synthesis circuit 522, the video output circuit 523, and the OSD rendering circuit 525 constitute an image data generating device.

Note that although an example case where an organic EL element is used as the light control element has been described above, the present invention is not limited thereto, and a liquid crystal element, an electrochromic element, an electrophoretic element, or an electrowetting element may also be used as the light control element.

Figure 28:
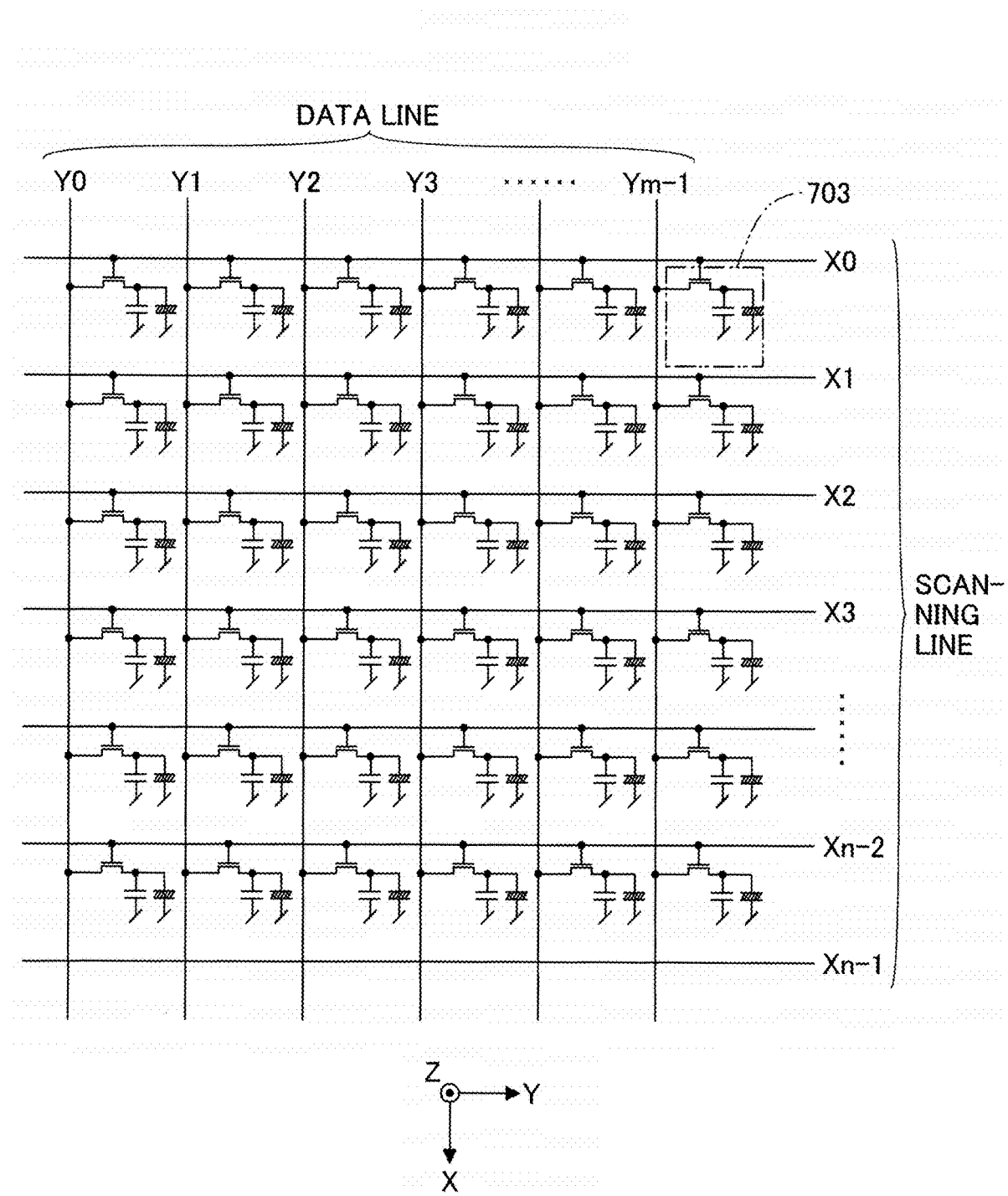
FIG. 28 is a first explanatory diagram of another example display element of the television apparatus according to the fourth embodiment.

For example, in the case where a liquid crystal element is used as the light control element, a liquid crystal display is used as the display 710. In this case, as illustrated in FIG. 28, display elements 703 of the display 710 do not require current supply lines.

Figure 29:
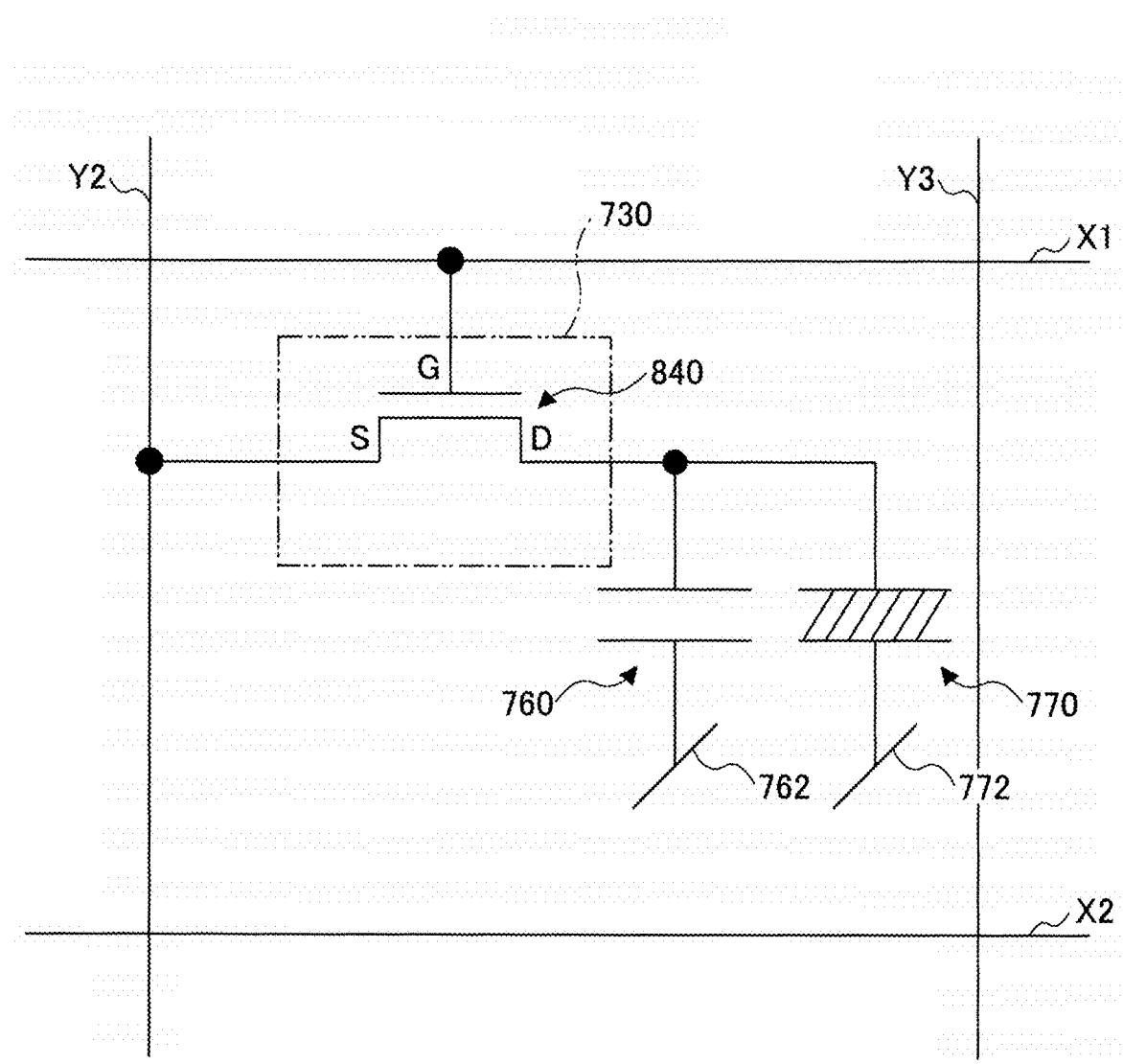
FIG. 29 is a second explanatory diagram of the other example display element of the television apparatus according to the fourth embodiment.

Also, in this case, as illustrated in FIG. 29, for example, a drive circuit 730 of the display element 703 may only include one field effect transistor 840 that is similar to the field effect transistor (810, 820) of FIG. 25. In the field effect transistor 840, the gate electrode G is connected to a predetermined scanning line, and the source electrode S is connected to a predetermined data line. Further, the drain electrode D is connected to a pixel electrode of a liquid crystal element 770 and a capacitor 760. Note that in FIG. 29, reference numerals 762 and 772 respectively represent counter electrodes (common counter electrodes) of the capacitor 760 and the liquid crystal element 770.

Note that although a television apparatus is described above as an example system according to the present embodiment, a system according to the present embodiment is not limited to the above example. That is, the present embodiment may be implemented by any system that includes the image display device 524 as a device for displaying images and information. For example, the present invention may be implemented by a computer system including a computer (e.g., personal computer) and the image display device 524 that are connected to each other.

Further, the image display device 524 may be used as display means of a mobile information device such as a cellular phone, a portable music playback device, a portable movie playback device, an electronic book, or a PDA (Personal Digital Assistant); or display means of an imaging device such as a still camera or a video camera, for example. Also, the image display device 524 may be used as display means for displaying various information in a vehicle system of a car, an aircraft, a train, a ship and the like, for example. Further, the image display device 524 may be used as display means for displaying various information in a measurement device, an analysis device, a medical device, an advertisement medium, and the like.

Although the present invention has been described above with respect to certain illustrative embodiments, the present invention is not limited to these embodiments, and numerous variations and modifications may be made without departing from the scope of the present invention.

What is claimed is:

1. A method for manufacturing a field effect transistor that includes a gate insulating layer and an electrode including a first conductive film and a second conductive film successively laminated on a predetermined surface of the gate insulating layer, the method comprising steps of:
   forming an oxide film including element A, which is an alkaline earth metal, and element B, which is at least one element selected from a group consisting of Ga, Sc, Y and a lanthanide, as the gate insulating layer;
   forming a first conductive film on the oxide film;
   forming a second conductive film on the first conductive film;
   etching the second conductive film with an etching solution having a higher etch rate for the second conductive film as compared with an etch rate for the first conductive film; and
   etching the first conductive film with an organic alkaline solution using the second conductive film as a mask, the organic alkaline solution having a higher etch rate for the first conductive film as compared with an etch rate for the oxide film, without etching a part of the first conductive film, the part being covered by the second conductive film as a mask.

2. The method for manufacturing a field effect transistor according to claim 1, the method further comprising steps of:
   forming a third conductive film on the second conductive film; and
   etching the third conductive film with an etching solution having a higher etch rate for the third conductive film as compared with an etch rate for the second conductive film;
   wherein, in the step of etching the first conductive film, the first conductive film is etched with the organic alkaline solution using the second conductive film and the third conductive film as masks.

3. The method for manufacturing a field effect transistor according to claim 1, wherein
   the first conductive film is a metal film including Al; and
   the second conductive film is a metal film including at least one of Mo, W, Ti, Ta, Cr, Cu, and Ni.

4. The method for manufacturing a field effect transistor according to claim 2, wherein
   the first conductive film is a metal film including Al;
   the second conductive film is a metal film including at least one of Mo, W, Ta, Cr, Au, Cu, and Ni; and
   the third conductive film is a metal film including Ti.

5. The method for manufacturing a field effect transistor according to any one of claim 1, wherein the oxide film includes a paraelectric amorphous oxide or consists of the paraelectric amorphous oxide.

6. The method for manufacturing a field effect transistor according to any one of claim 1, wherein the oxide film further includes element C, which is at least one element selected from a group consisting of Al, Ti, Zr, Hf, Nb, and Ta.

* * * * *